US012593727B2

(12) United States Patent
Kim et al.

(10) Patent No.: US 12,593,727 B2
(45) Date of Patent: Mar. 31, 2026

(54) DISPLAY DEVICE USING SEMICONDUCTOR LIGHT-EMITTING DIODES, AND METHOD FOR MANUFACTURING SAME

(71) Applicant: LG ELECTRONICS INC., Seoul (KR)

(72) Inventors: Jungsub Kim, Seoul (KR); Yeonhong Jung, Seoul (KR); Sunghyun Moon, Seoul (KR); Myoungsoo Kim, Seoul (KR); Yoonchul Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 724 days.

(21) Appl. No.: 17/910,275

(22) PCT Filed: Mar. 13, 2020

(86) PCT No.: PCT/KR2020/003504
§ 371 (c)(1),
(2) Date: Sep. 8, 2022

(87) PCT Pub. No.: WO2020/122695
PCT Pub. Date: Jun. 18, 2020

(65) Prior Publication Data
US 2023/0127225 A1 Apr. 27, 2023

(51) Int. Cl.
*H01L 25/075* (2006.01)
*G01R 31/26* (2020.01)
(Continued)

(52) U.S. Cl.
CPC ...... *H01L 25/0753* (2013.01); *G01R 31/2635* (2013.01); *G09G 3/006* (2013.01);
(Continued)

(58) Field of Classification Search
None
See application file for complete search history.

(56) References Cited

U.S. PATENT DOCUMENTS

| | | | |
|---|---|---|---|
| 9,825,202 B2 | 11/2017 | Schuele et al. | |
| 2017/0338211 A1 | 11/2017 | Lin et al. | |
| 2018/0138235 A1* | 5/2018 | Lee | H10H 20/01 |

FOREIGN PATENT DOCUMENTS

| | | |
|---|---|---|
| KR | 10-2016-0010869 | 1/2016 |
| KR | 10-2018-0109263 | 10/2018 |

(Continued)

OTHER PUBLICATIONS

PCT International Application No. PCT/KR2020/003504, International Search Report dated Dec. 4, 2020, 7 pages.
(Continued)

*Primary Examiner* — Feifei Yeung Lopez
(74) *Attorney, Agent, or Firm* — LEE, HONG, DEGERMAN, KANG & WAIMEY

(57) ABSTRACT

The display device according to the present invention comprises: a substrate; semiconductor light-emitting diodes disposed on the substrate; a planarization layer formed so as to cover the semiconductor light-emitting diodes; and wire electrodes electrically connected to the semiconductor light-emitting diodes, wherein the substrate comprises individual pixel areas in which the semiconductor light-emitting diodes are disposed, and the individual pixel areas are each any one of first individual pixel areas, in which the semiconductor light-emitting diodes are disposed and which emit the light output by the semiconductor light-emitting diodes, and second individual pixel areas, in which a repair layer is disposed so as to emit the light output by an adjacent first individual pixel area.

8 Claims, 21 Drawing Sheets

(a)

(b)

(51) Int. Cl.

| | |
|---|---|
| *G09G 3/00* | (2006.01) |
| *H01L 21/66* | (2006.01) |
| *H10H 20/01* | (2025.01) |
| *H10H 20/852* | (2025.01) |
| *H10H 20/856* | (2025.01) |
| *H10H 20/80* | (2025.01) |

(52) U.S. Cl.

CPC ............. *H01L 22/22* (2013.01); *H10H 20/01* (2025.01); *H10H 20/852* (2025.01); *H10H 20/856* (2025.01); *H10H 20/0362* (2025.01); *H10H 20/0363* (2025.01); *H10H 20/882* (2025.01)

(56) References Cited

FOREIGN PATENT DOCUMENTS

| | | |
|---|---|---|
| KR | 10-2019-0096474 | 8/2019 |
| KR | 10-2019-0120467 | 10/2019 |
| KR | 10-2020-0014868 | 2/2020 |

OTHER PUBLICATIONS

Korean Intellectual Property Office Application No. 10-2022-7025686, Office Action dated Mar. 29, 2024, 7 pages.

\* cited by examiner (a)

(b)

(a)

(b)

(a)

(b)

(a)

(b)

(a)

(b)

(a)

(b)

(a)

(b)

(a)

(b)

DISPLAY DEVICE USING SEMICONDUCTOR LIGHT-EMITTING DIODES, AND METHOD FOR MANUFACTURING SAME

CROSS-REFERENCE TO RELATED APPLICATIONS

This application is the National Stage filing under 35 U.S.C. 371 of International Application No. PCT/KR2020/003504, filed on Mar. 13, 2020, the contents of which are hereby incorporated by reference herein its entirety.

TECHNICAL FIELD

The present disclosure relates to a display device using a semiconductor light-emitting diode, particularly, a semiconductor light-emitting diode having a size of several to several tens of μm, and a method for manufacturing the same.

BACKGROUND ART

In recent years, liquid crystal displays (LCDs), organic light-emitting diode (OLED) displays, and micro-LED displays have been competed to implement a large-area display in the field of display technology.

Among them, a display using a semiconductor light-emitting diode (micro-LED) having a diameter or cross-sectional area of 100 μm or less may provide very high efficiency because it does not absorb light using a polarizing plate or the like.

However, since millions of semiconductor light-emitting diodes are required to implement a large area in the case of a micro-LED display, it has difficulty in transferring the devices compared to other technologies.

Technologies currently in development for transfer processes of micro-LEDs include pick & place, laser lift-off (LLO), self-assembly, or the like.

DISCLOSURE OF INVENTION

Technical Problem

An aspect of the present disclosure is to provide a display device to which a new repair method is applied and a method for manufacturing the same.

Specifically, an aspect of the present disclosure is to provide a display device having a structure using light output from a semiconductor light-emitting diode disposed around a defective semiconductor light-emitting diode to replace the defective semiconductor light-emitting diode, and a method for manufacturing the same.

Solution to Problem

A display device according to the present disclosure may include a substrate, semiconductor light-emitting diodes disposed on the substrate, a planarization layer formed to cover the semiconductor light-emitting diodes, and a wiring electrode electrically connected to the semiconductor light-emitting diodes, wherein the substrate includes individual pixel regions in which the semiconductor light-emitting diodes are disposed, and the individual pixel regions correspond to either one of a first individual pixel region in which the semiconductor light-emitting diodes are disposed to emit light output from the semiconductor light-emitting diodes;

and a second individual pixel region in which a repair layer is disposed to emit light output from the first individual pixel region adjacent thereto.

According to the present disclosure, the substrate may include sub-pixel regions configured with a plurality of adjacent individual pixel regions, wherein the sub-pixel regions correspond to any one of a first sub-pixel region configured with only the first individual pixel regions; a second sub-pixel region configured with only the second individual pixel regions; and a third sub-pixel region configured with the first and second individual pixel regions.

According to the present disclosure, in the second sub-pixel region, a repair layer may be continuously formed over a plurality of individual pixel regions constituting the second sub-pixel region.

According to the present disclosure, the display device may further include an extended repair layer formed to surround a plurality of individual pixel regions constituting the third sub-pixel region, wherein the extended repair layer includes a discontinuous point.

According to the present disclosure, the repair layer may be formed of a material having a refractive index smaller than that of the planarization layer.

According to the present disclosure, the repair layer may include a scatterer or a reflector.

According to the present disclosure, the planarization layer may include a first planarization layer having a first refractive index; and a second planarization layer having a second refractive index smaller than that of the first refractive index, wherein the first planarization layer is formed to cover individual pixel regions constituting the third sub-pixel region.

According to the present disclosure, the first planarization layer may be formed to extend to a first sub-pixel region adjacent to the third sub-pixel region to cover individual pixel regions constituting the adjacent first sub-pixel region.

According to the present disclosure, the first planarization layer may be formed to cover the third sub-pixel region and at least a portion of the first sub-pixel region adjacent to the third sub-pixel region.

A method of manufacturing a display device according to the present disclosure may include disposing semiconductor light-emitting diodes in an individual pixel region of a substrate; forming a planarization layer to cover the semiconductor light-emitting diodes, and forming a wiring electrode electrically connected to the semiconductor light-emitting diode on the planarization layer; removing a defective semiconductor light-emitting diode from among the semiconductor light-emitting diodes, a planarization layer covering the defective semiconductor light-emitting diode, and a wiring electrode electrically connected to the defective semiconductor light-emitting diode; and forming a repair layer on an individual pixel region from which the defective semiconductor light-emitting diode is removed.

According to the present disclosure, the method may further include removing a semiconductor light-emitting diode adjacent to the defective semiconductor light-emitting diode, a planarization layer covering the semiconductor light-emitting diode, and a wiring electrode electrically connected to the semiconductor light-emitting diode, wherein the repair layer is formed to extend from an individual pixel region from which the defective semiconductor light-emitting diode is removed to an individual pixel region from which a semiconductor light-emitting diode adjacent to the defective semiconductor light-emitting diode is removed.

According to the present disclosure, the method may further include removing the defective semiconductor light-emitting diode and a portion of the planarization layer around the semiconductor light-emitting diode adjacent to the defective semiconductor light-emitting diode; and forming the repair layer on a region from which the planarization layer is removed.

A method of manufacturing a display device according to the present disclosure may include forming a wiring electrode on a substrate, and disposing semiconductor light-emitting diodes to be electrically connected to the wiring electrode in individual pixel regions of the substrate; removing a defective semiconductor light-emitting diode from among the semiconductor light-emitting diodes and a wiring electrode electrically connected to the defective semiconductor light-emitting diode; forming a repair layer on an individual pixel region from which the defective semiconductor light-emitting diode is removed; and forming a planarization layer to cover the semiconductor light-emitting diodes and the repair layer.

According to the present disclosure, the forming of the planarization layer may include forming a first planarization layer to cover at least the repair layer and a semiconductor light-emitting diode adjacent to the repair layer; and forming a second planarization layer on an entire surface of the substrate, wherein a refractive index of the first planarization layer is greater than that of the second planarization layer.

Advantageous Effects of Invention

The present disclosure has an effect of maintaining the quality of a display panel while simplifying a post-process by using light output from a semiconductor light-emitting diode disposed around a defective semiconductor light-emitting diode to replace the defective semiconductor light-emitting diode.

4

Figure 14:
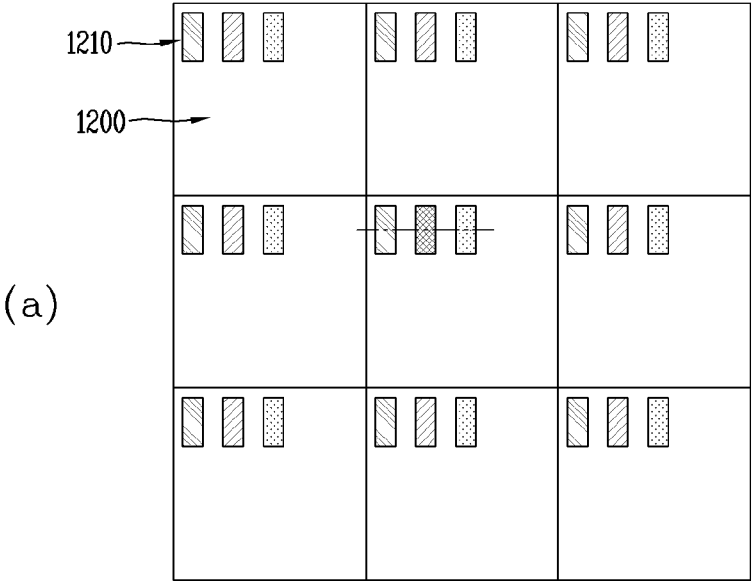
Figure 14:
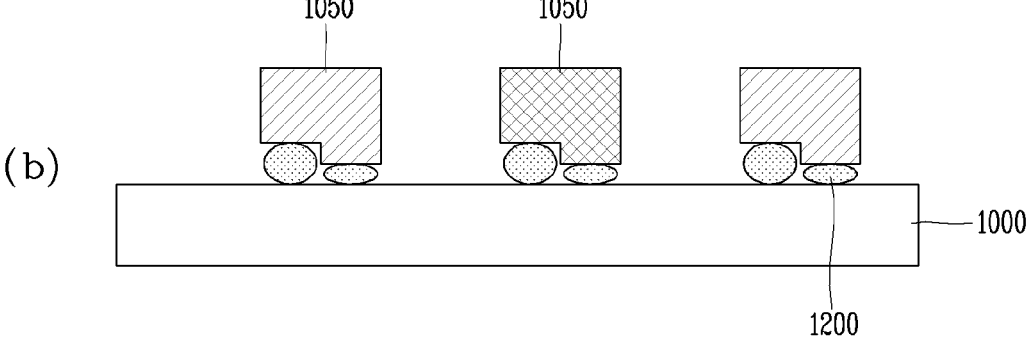
Figure 15:
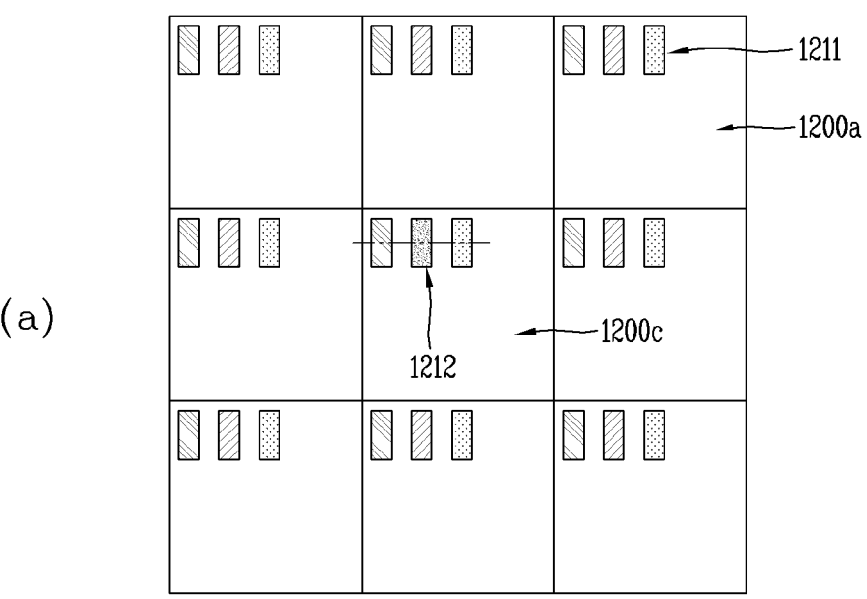
Figure 15:
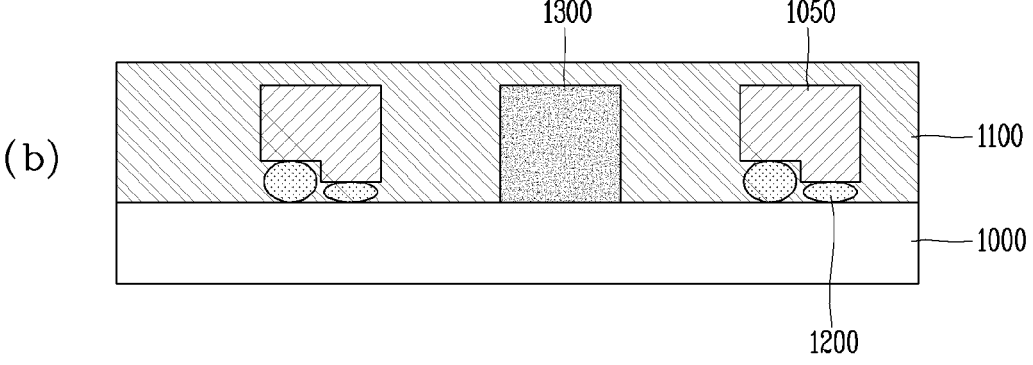
Figure 16:
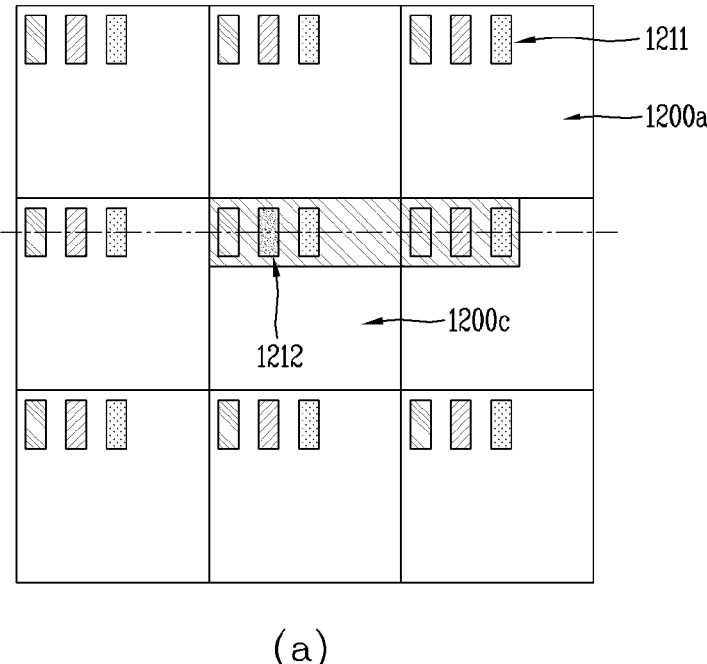
Figure 16:
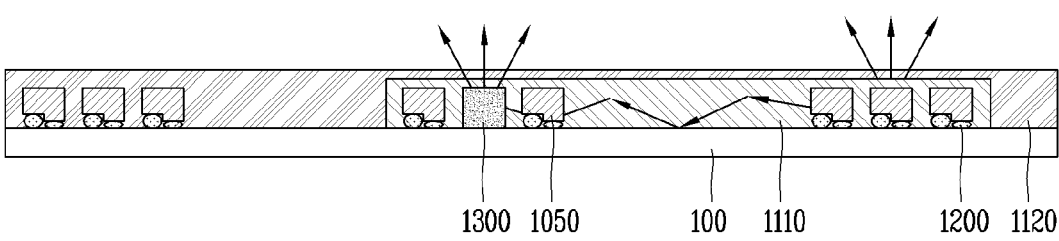
Figure 17:
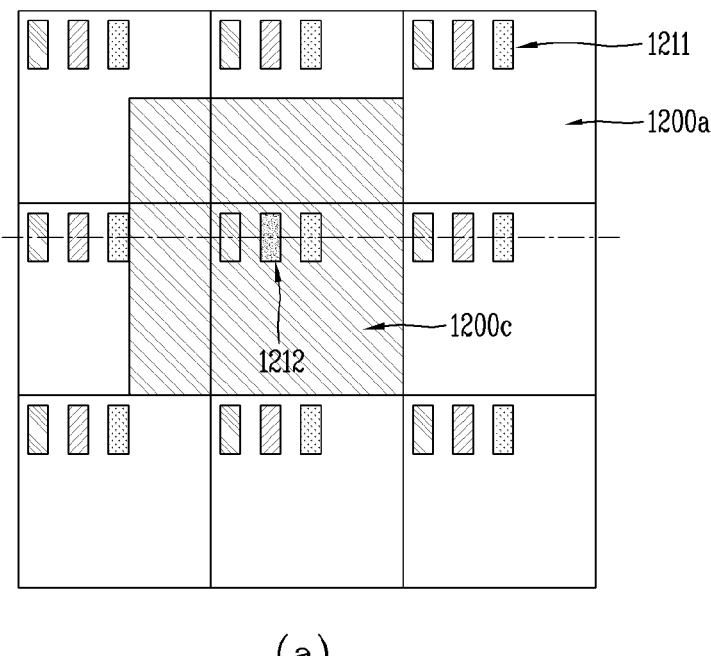
Figure 17:
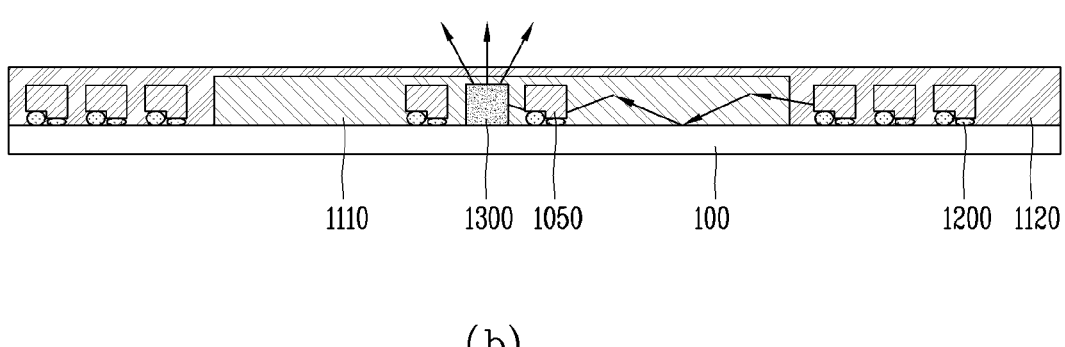

FIGS. 15 to 17 are conceptual views for explaining various embodiments of a repair structure applied to the display device according to FIG. 14.

Figure 11:
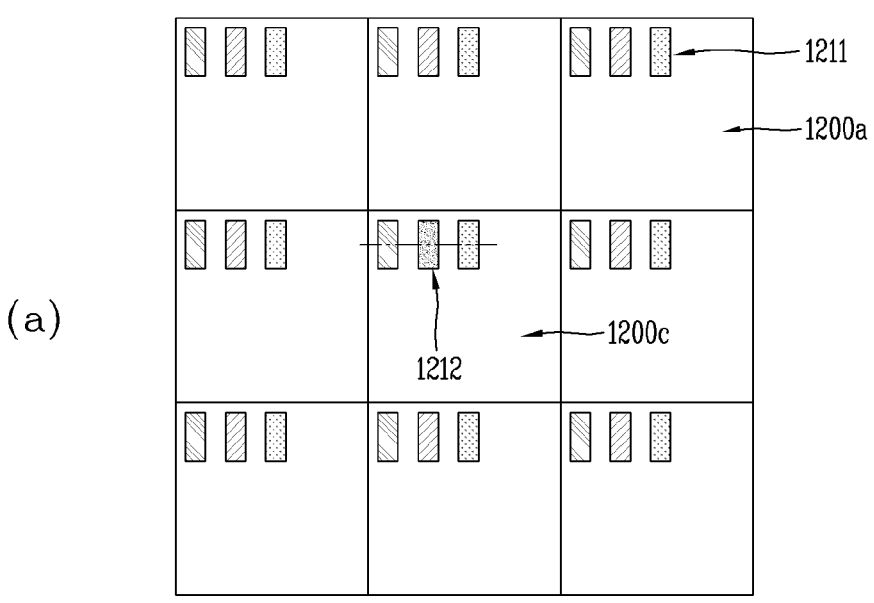
FIGS. 11 to 13 are conceptual views for explaining various embodiments of a repair structure applied to the display device according to FIG. 10.
Figure 11:
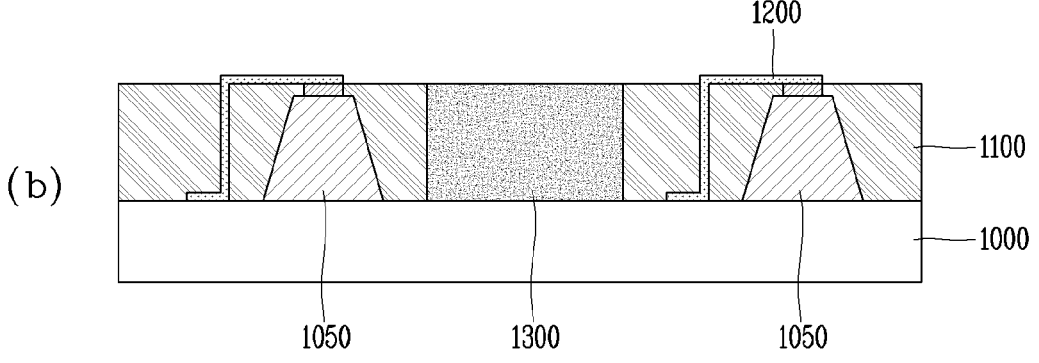
Figure 12:
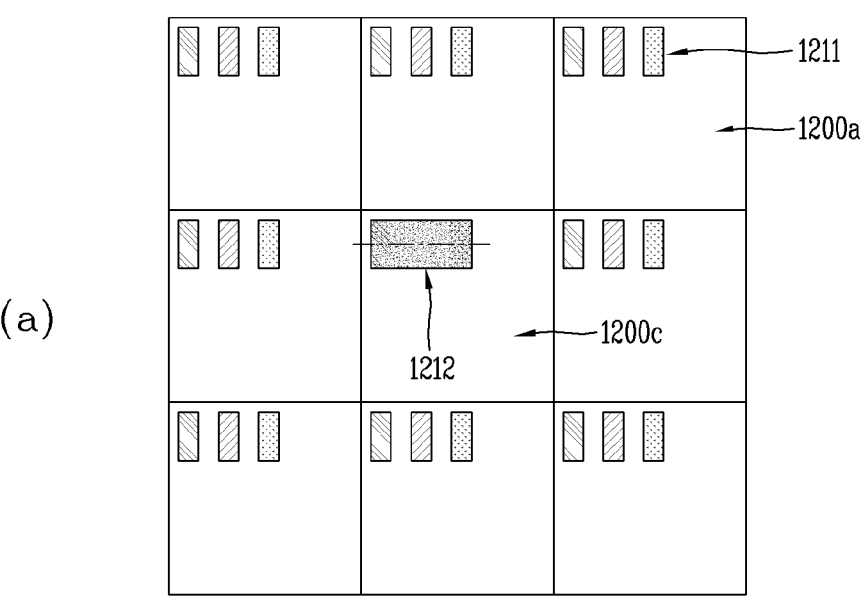
Figure 12:
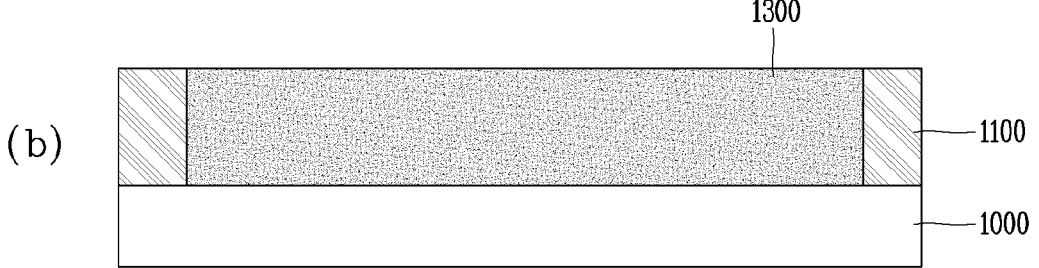
Figure 13:
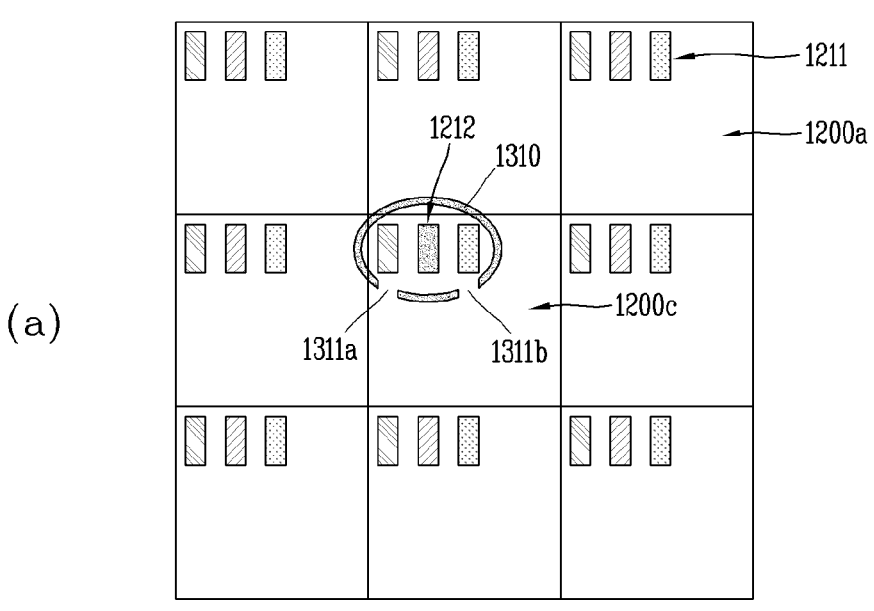
Figure 13:
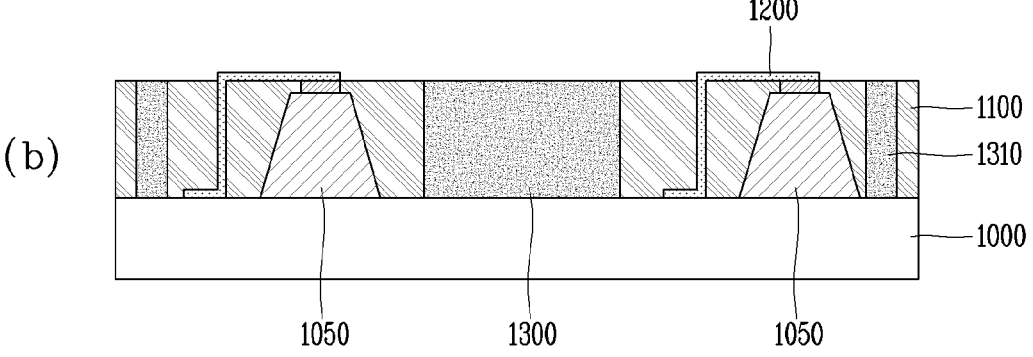
Figure 18A:
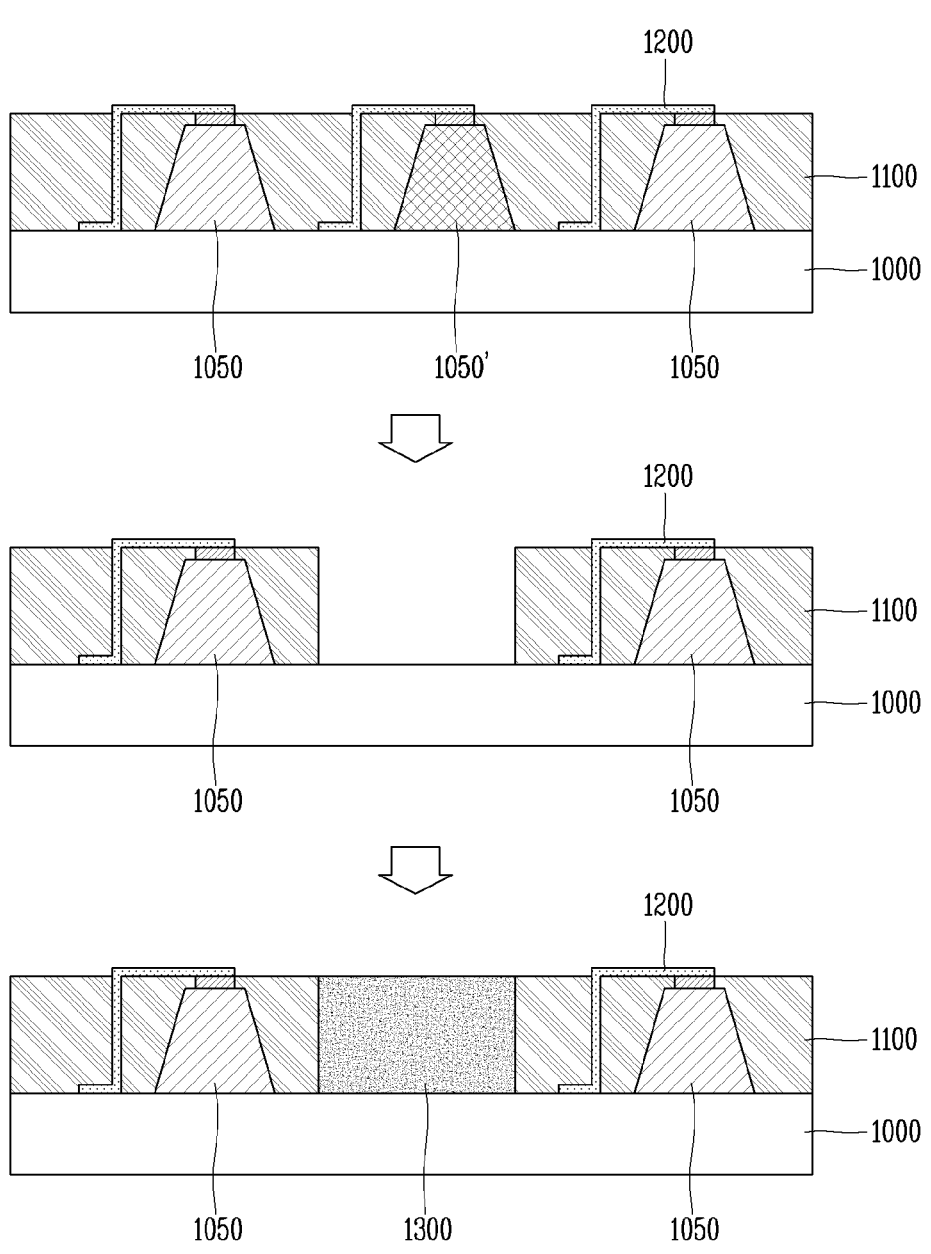
Figure 18B:
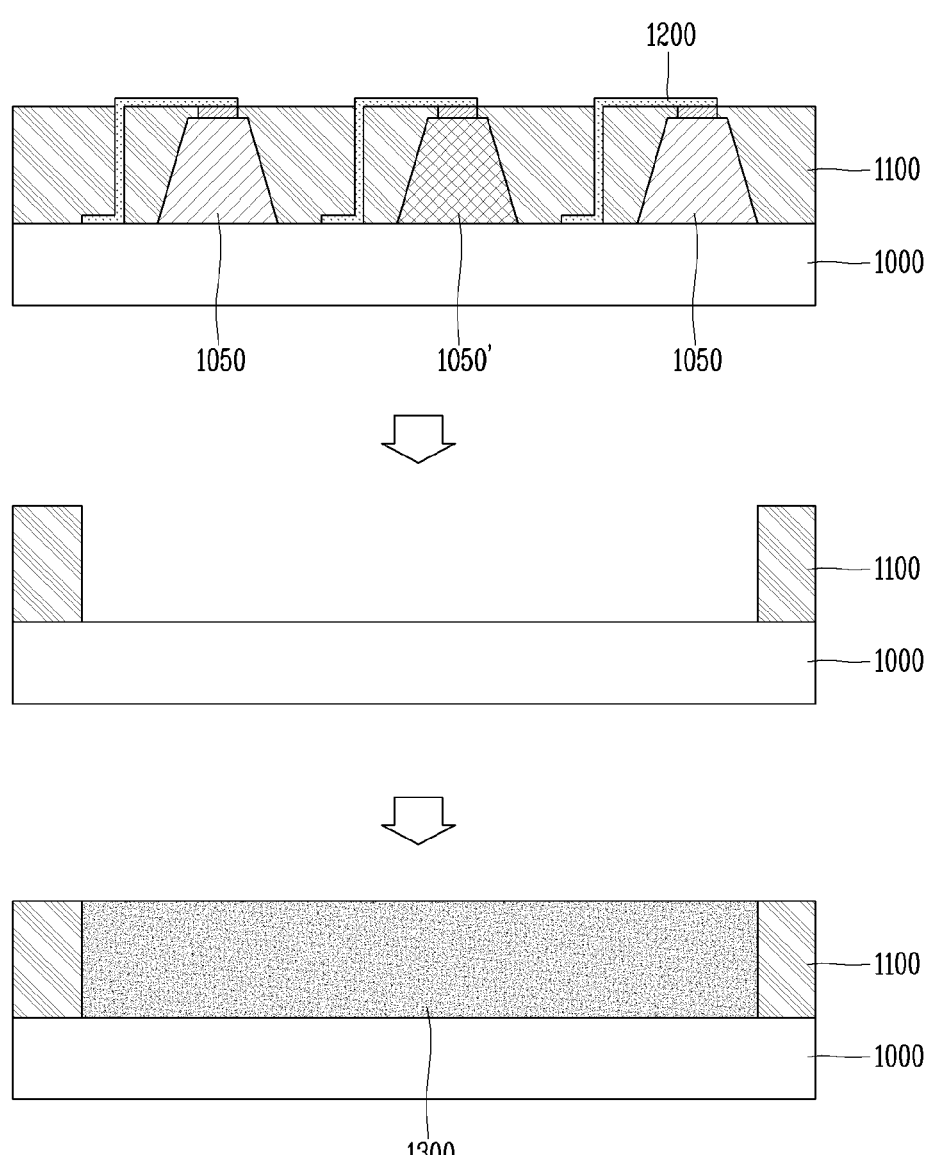
Figure 18C:
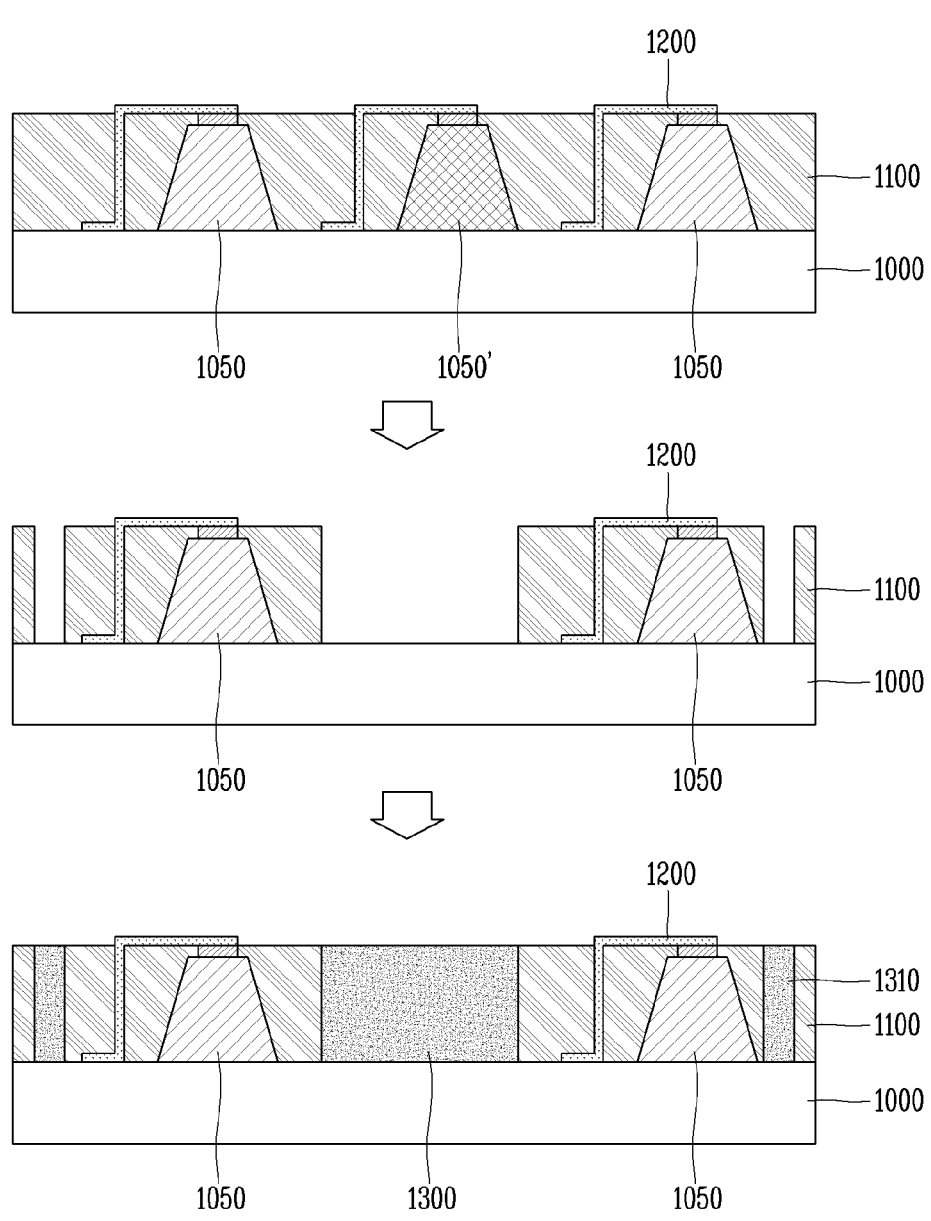

FIGS. 18A to 18C are conceptual views for respectively explaining a method of manufacturing the repair structure according to FIGS. 11 to 13.

Figure 19A:
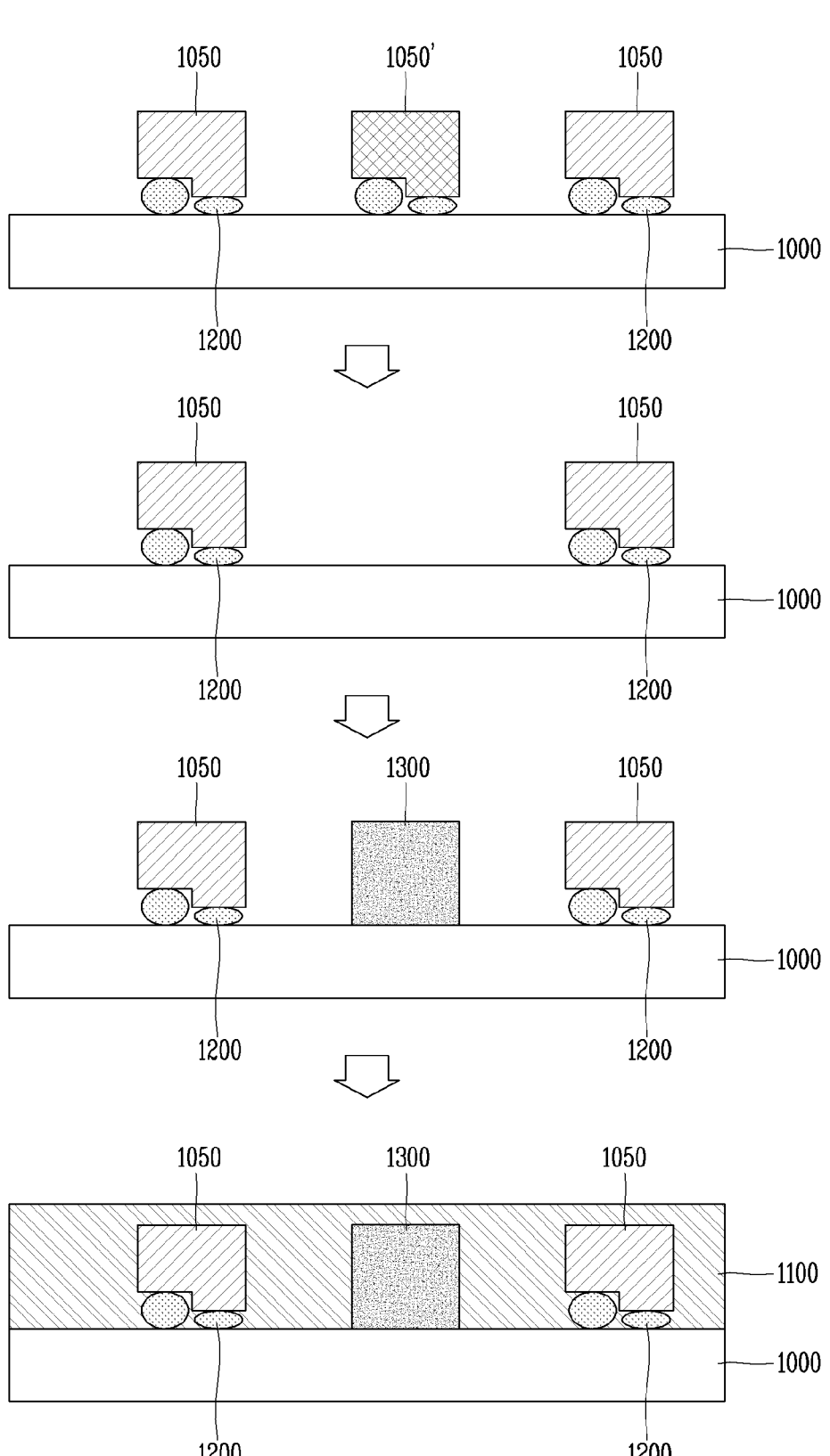
Figure 19B:
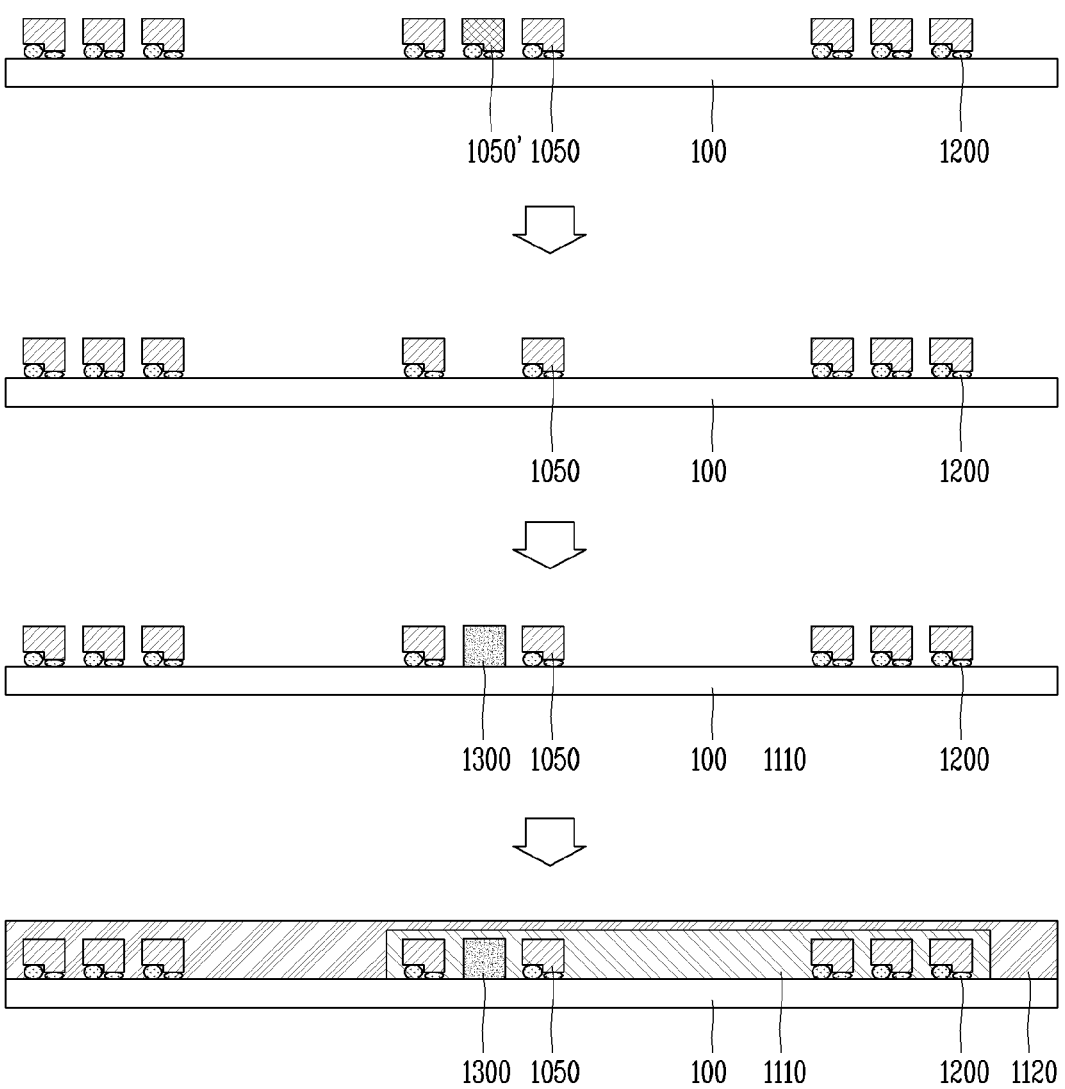
Figure 19C:
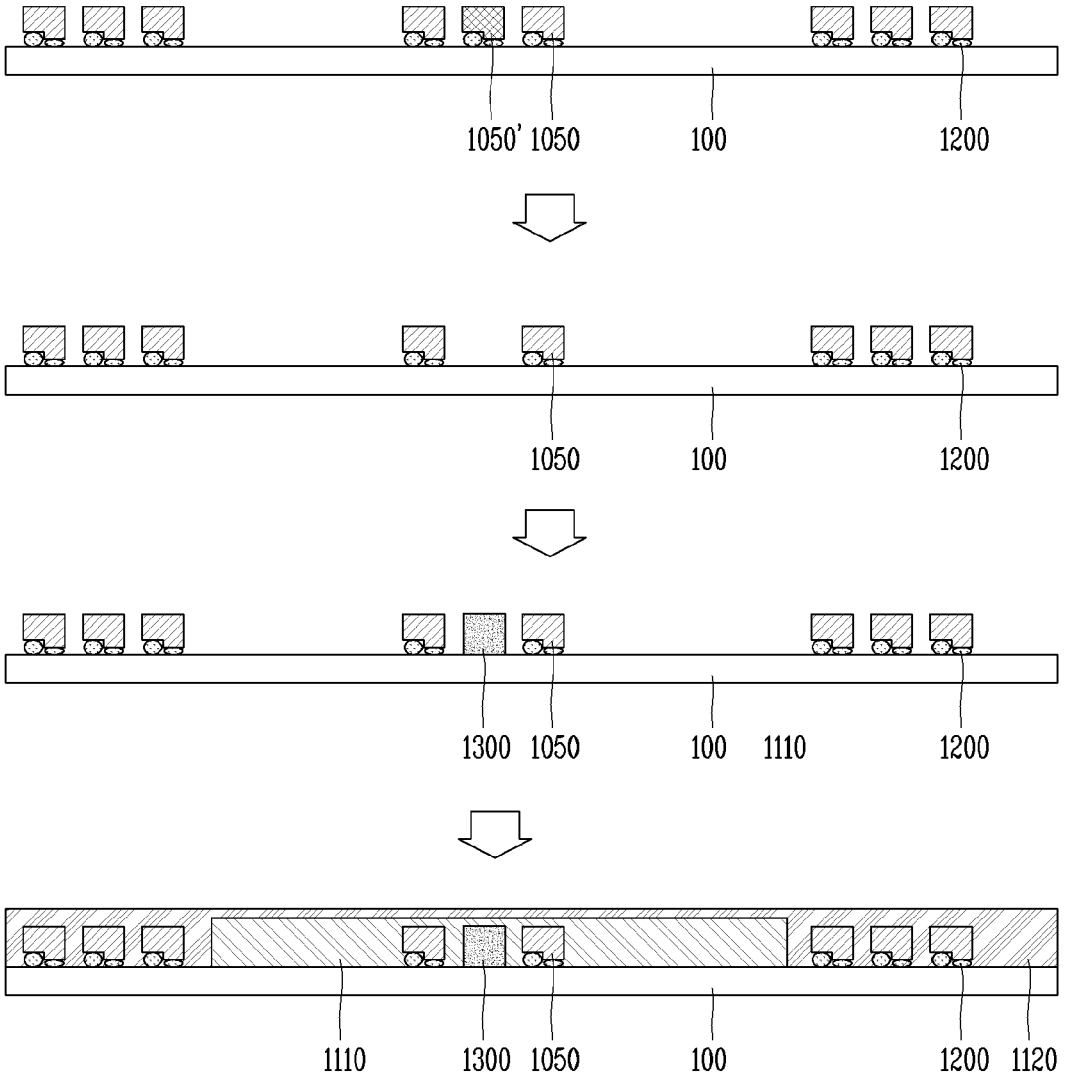

FIGS. 19A to 19C are conceptual views for respectively explaining a method of manufacturing the repair structure according to FIGS. 15 to 17.

MODE FOR THE INVENTION

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings. Furthermore, it will be understood that when an element such as a layer, region or substrate is referred to as being "on" another element, it can be directly on the other element or an intermediate element may also be interposed therebetween.

A display device disclosed herein may include a mobile phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, even if a new product type to be developed later includes a display, a configuration according to an embodiment disclosed herein may be applicable thereto.

Figure 1:
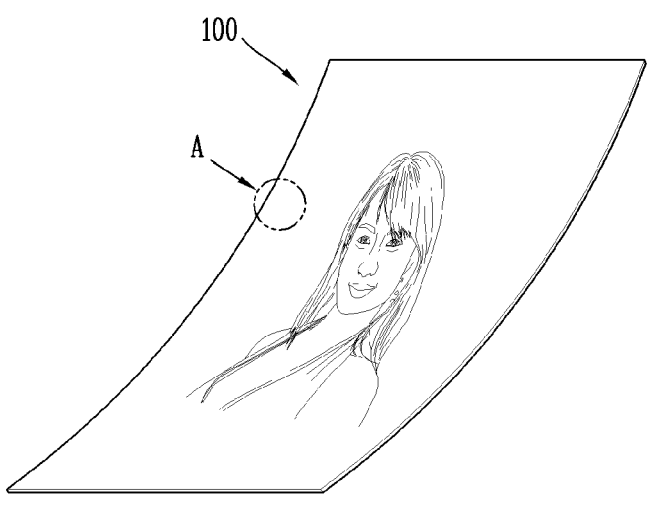
FIG. 1 is a conceptual view showing a display device using a semiconductor light-emitting diode according to an embodiment of the present disclosure.

FIG. 1 is a conceptual view showing a display device using a semiconductor light-emitting diode according to an embodiment of the present disclosure.

According to the drawing, information processed in the controller of the display device 100 may be displayed on a flexible display. The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display region of the flexible display becomes a plane in a configuration that the flexible display is not warped (e.g., a configuration having an infinite radius of curvature, hereinafter, referred to as a "first configuration"). The display region thereof becomes a curved surface in a configuration that the flexible display is warped by an external force in the first configuration (e.g., a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting diode. According to the present disclosure, a light-emitting diode (LED) is illustrated as a type of semiconductor light-emitting diode. The light-emitting diode may be formed with a small size to perform the role of a sub-pixel even in the second configuration through this.

Hereinafter, a flexible display implemented using the light-emitting diode will be described in more detail with reference to the accompanying drawings.

Figure 2:
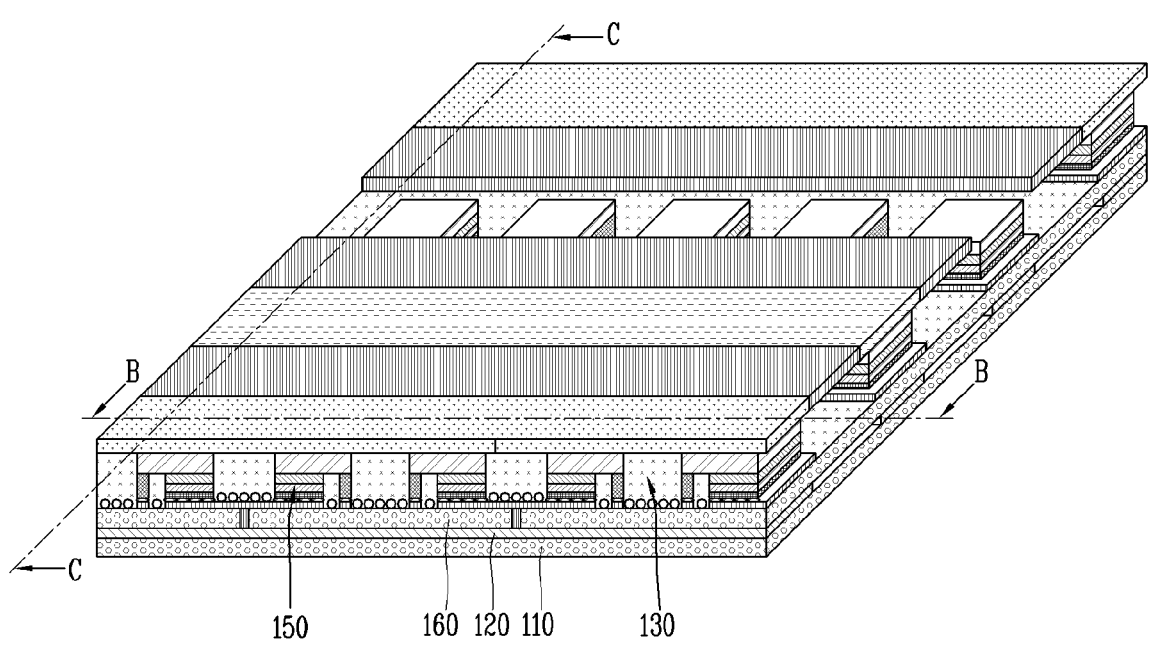
FIG. 2 is a partial enlarged view of portion "A" in the display device of FIG. 1, and FIGS. 3A and 3B are cross-sectional views taken along lines B-B and C-C in FIG. 2.
Figure 3A:
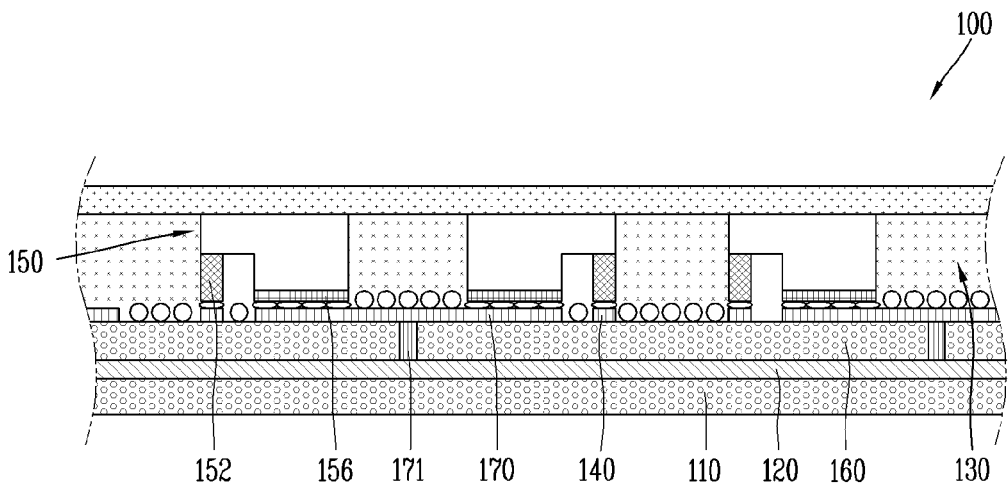
Figure 3B:
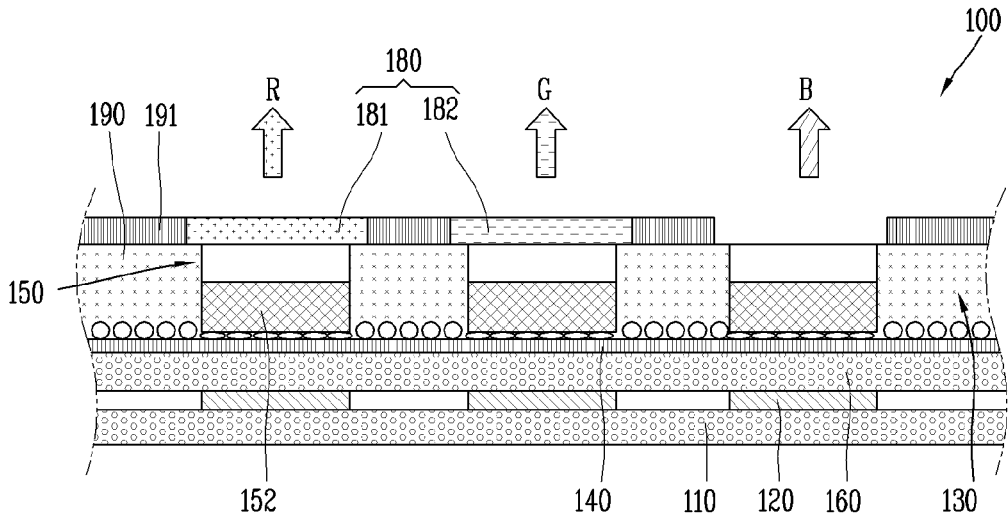
Figure 4:
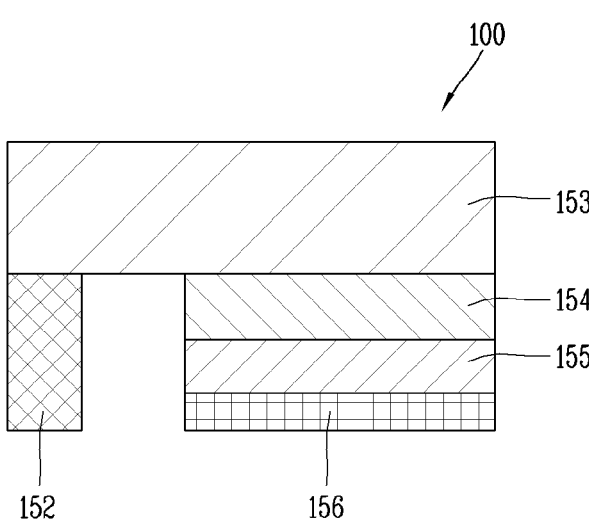
FIG. 4 is a conceptual view showing a flip-chip type semiconductor light-emitting diode in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view showing a flip-chip type semiconductor light-emitting diode in FIG. 3A, and FIGS. 5A to 5C are conceptual views showing various forms for implementing colors in connection with a flip-chip type semiconductor light-emitting diode.

FIGS. 2, 3A and 3B illustrate a display device 100 using a passive matrix (PM) type semiconductor light-emitting diode as a display device 100 using a semiconductor light-emitting diode. However, an example described below may also be applicable to an active-matrix (AM) type semiconductor light-emitting diode.

The display device 100 may include a substrate 110, a first electrode 120, a conductive adhesive layer 130, a second electrode 140, and a plurality of semiconductor light-emitting diodes 150.

The substrate 110 may be a flexible substrate. The substrate 110 may include glass or polyimide (PI) to implement flexible performance. In addition, an insulating and flexible material such as polyethylene naphthalate (PEN) or polyethylene terephthalate (PET) may be used as a component of the substrate 110. Furthermore, the substrate 110 may be either one of transparent and non-transparent materials.

The substrate 110 may be a wiring substrate disposed with the first electrode 120, and the first electrode 120 may be placed on the substrate 110.

According to the drawing, an insulating layer 160 may be deposited and formed on the substrate 110 placed with the first electrode 120, and an auxiliary electrode 170 may be disposed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PEN, PET or the like to form a single wiring substrate.

The auxiliary electrode 170 as an electrode for electrically connecting the first electrode 120 to the semiconductor light-emitting diode 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling into a conductive material into a via hole.

According to the accompanying drawings, the conductive adhesive layer 130 may be formed on one surface of the insulating layer 160, but the present disclosure may not be necessarily limited to this. For example, a layer performing a specific function may be formed between the insulating layer 160 and the conductive adhesive layer 130, and a structure in which the conductive adhesive layer 130 is disposed on a substrate without the insulating layer 160 is also allowed. The conductive adhesive layer 130 may serve as an insulating layer in the structure in which the conductive adhesive layer 130 is disposed on the substrate.

The conductive adhesive layer 130 may be a layer having adhesiveness and conductivity, and to this end, a conductive material and an adhesive material may be mixed and formed in the conductive adhesive layer 130. Furthermore, the conductive adhesive layer 130 may have flexibility, thereby allowing a flexible function in the display device.

For an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through a thickness thereof, but may be configured as an electrical insulating layer in the horizontal x-y direction. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Herein, it is described that heat and pressure are applied to the anisotropic conductive film, but another method (e.g., only either one of heat and pressure is applied or a UV curing method) may be used to allow the anisotropic conductive film to have partial conductivity.

Furthermore, the anisotropic conductive medium may be conductive balls or conductive particles. According to the drawing, the anisotropic conductive film is a film in which conductive balls are mixed with an insulating base member, and when heat and pressure are applied, only a specific portion thereof has conductivity by the conductive balls. The anisotropic conductive film may be in a state in which a core with a conductive material contains a plurality of particles coated by an insulating layer with a polymer material, and in this case, it may have conductivity by means of the core while breaking an insulating layer of particles contained in a portion to which heat and pressure are applied. Here, the shape of the core may be deformed to form a layer in contact with each other in a thickness direction of the film. More specifically, heat and pressure may be applied to the anisotropic conductive film as a whole, and an electrical connection in the z-axis direction may be partially formed by a height difference of a counterpart adhered by the anisotropic conductive film.

For another example, the anisotropic conductive film may be in a state in which an insulating core contains a plurality of particles coated with a conductive material. In this case, the conductive material in the portion to which heat and pressure is applied is deformed (stuck) to have conductivity in the thickness direction of the film. For another example, a form in which the conductive material passed through the insulating base member in the z-axis direction to have conductivity in the thickness direction of the film may also be allowed, and in this case, the conductive material may have a pointed end.

According to the drawing, the anisotropic conductive film may be a fixed array anisotropic conductive film (ACF) configured with a form in which conductive balls are inserted into one surface of the insulating base member. The insulating base member is formed of a material having an adhesive property, and the conductive balls are intensively disposed at a bottom portion of the insulating base member, and is deformed together with the conductive balls to have conductivity in a vertical direction when heat and pressure are applied from the base member.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the accompanying drawings, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed on the insulating layer 160 in a state that the auxiliary electrode 170 and second electrode 140 are located, and then the semiconductor light-emitting diode 150 is connected thereto in a flip chip form with the application of heat and pressure, the semiconductor light-emitting diode 150 is electrically connected to the first electrode 120 and second electrode 140.

The semiconductor light-emitting diode 150 may be a flip chip type light-emitting diode as shown in FIG. 4.

For example, the semiconductor light-emitting diode 150 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in a horizontal direction on the n-type semiconductor layer 153. In this case, the p-type electrode 156 may be electrically connected to the auxiliary electrode 170 by the conductive adhesive layer 130, and the n-type electrode 152 may be electrically connected to the second electrode 140.

Referring to FIGS. 2, 3A and 3B, the auxiliary electrode 170 may be formed in an elongated manner in one direction so that one auxiliary electrode 170 may be electrically connected to the plurality of semiconductor light-emitting diodes 150. For example, the p-type electrodes 156 of the semiconductor light-emitting diodes 150 on the left and right with respect to the auxiliary electrode 170 may be electrically connected to one auxiliary electrode.

More specifically, the semiconductor light-emitting diode 150 is pressed into the conductive adhesive layer 130, and through this, only a portion between the p-type electrode 156 and auxiliary electrode 170 of the semiconductor light-emitting diode 150 and a portion between the n-type electrode 152 and second electrode 140 of the semiconductor light-emitting diode 150 have conductivity, and the remaining portion does not have conductivity since there is no push-down of the semiconductor light-emitting diode 150. As described above, the conductive adhesive layer 130 may form an electrical connection as well as allow a mutual coupling between the semiconductor light-emitting diode 150 and the auxiliary electrode 170 and between the semiconductor light-emitting diode 150 and the second electrode 140.

Furthermore, a plurality of semiconductor light-emitting diodes 150 constitute a light-emitting array, and a phosphor layer 180 is formed on the light-emitting array.

The light-emitting diode array may include a plurality of semiconductor light-emitting diodes 150 with different self-luminance values. Each of the semiconductor light-emitting diodes 150 constitutes a sub-pixel, and is electrically connected to the first electrode 120. For example, there may exist a plurality of first electrodes 120, and the semiconductor light-emitting diodes 150 are arranged in several rows, and each row of the semiconductor light-emitting diodes 150 may be electrically connected to any one of the plurality of first electrodes.

Furthermore, the semiconductor light-emitting diodes 150 may be connected in a flip chip form, and thus semiconductor light-emitting diodes 150 grown on a transparent dielectric substrate. The semiconductor light-emitting diodes 150 may be, for example, nitride semiconductor light-emitting diodes. The semiconductor light-emitting diode 150 has an excellent luminance characteristic, and thus it may be possible to configure individual sub-pixels even with a small size thereof.

Referring to the drawings, a partition wall 190 may be formed between the semiconductor light-emitting diodes 150. In this case, the partition wall 190 may perform the role of dividing individual sub-pixels from one another, and be formed as an integral body with the conductive adhesive layer 130. For example, a base member of the anisotropic conductive film may form the partition wall 190 by inserting the semiconductor light-emitting diode 150 into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. When the partition wall 190 of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting diode 150. For example, when the semiconductor light-emitting diode 150 is a blue semiconductor light-emitting diode that emits blue (B) light, and the phosphor layer 180 may perform the role of converting the blue (B) light into the color of a sub-pixel. The phosphor layer 180 may be a red phosphor layer 181 or green phosphor layer 182 constituting individual pixels.

In other words, a red phosphor 181 capable of converting blue (B) light into red (R) light may be deposited on the blue semiconductor light-emitting diode 151 at a location implementing a red sub-pixel, and a green phosphor 182 capable of converting blue (B) light into green (G) light may be deposited on the blue semiconductor light-emitting diode 151 at a location implementing a green sub-pixel. Furthermore, only the blue semiconductor light-emitting diode 151 may be solely used at a location implementing a blue sub-pixel. In this case, the red (R), green (G) and blue (B) sub-pixels may implement one pixel. Specifically, the phosphor 180 of one color may be deposited along each line of the first electrode 120, and thus, one line in the first electrode 120 may be an electrode that controls one color. In other words, red (R), green (B) and blue (B) may be sequentially disposed along the second electrode 140, thereby implementing sub-pixels.

However, the present disclosure may not be necessarily limited to this, and the semiconductor light-emitting diode 150 may be combined with a quantum dot (QD) instead of the phosphor 180 to implement sub-pixels such as red (R), green (G) and blue (B).

In addition, a black matrix 191 may be disposed between the respective phosphor layers 180 to enhance contrast.

However, the present disclosure may not be necessarily limited to this, and another structure for implementing blue, red and green may be also applicable thereto.

Figure 5A:
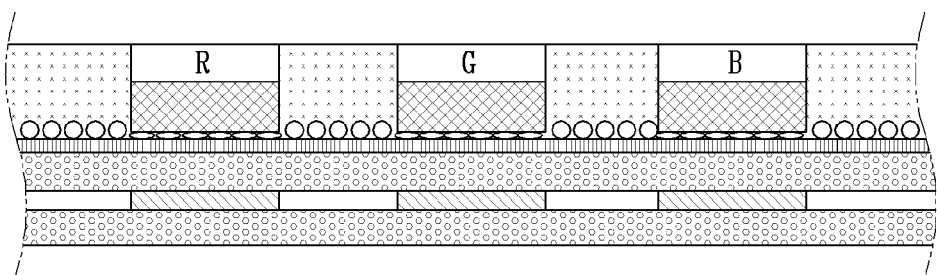
FIGS. 5A through 5C are conceptual views showing various forms for implementing colors in connection with a flip-chip type semiconductor light-emitting diode.

Referring to FIG. 5A, each of the semiconductor light-emitting diodes 150 may be implemented with a high-power light-emitting diode that emits light of various colors including blue in which gallium nitride (GaN) is mostly used, and indium (In) and or aluminum (Al) are added thereto.

In this case, the semiconductor light-emitting diode 150 may be provided with red, green and blue semiconductor light-emitting diodes, respectively, to implement each sub-pixel. For example, red, green and blue semiconductor light-emitting diodes (R, G, B) are alternately disposed, and red, green and blue sub-pixels implement one pixel by means of the red, green and blue semiconductor light-emitting diodes, thereby implementing a full color display.

Figure 5B:
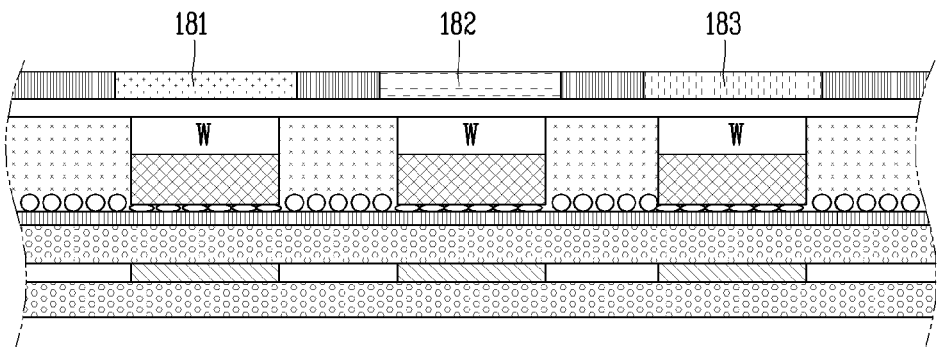

Referring to FIG. 5B, the semiconductor light-emitting diode may be a white light-emitting diode (W) provided with a yellow phosphor layer for each element. In this case, a red phosphor layer 181, a green phosphor layer 182 and a blue phosphor layer 183 may be provided on the white light-emitting diode (W) to implement a sub-pixel. Furthermore, a color filter repeated with red, green and blue on the white light-emitting diode (W) may be used to implement a sub-pixel.

Figure 5C:
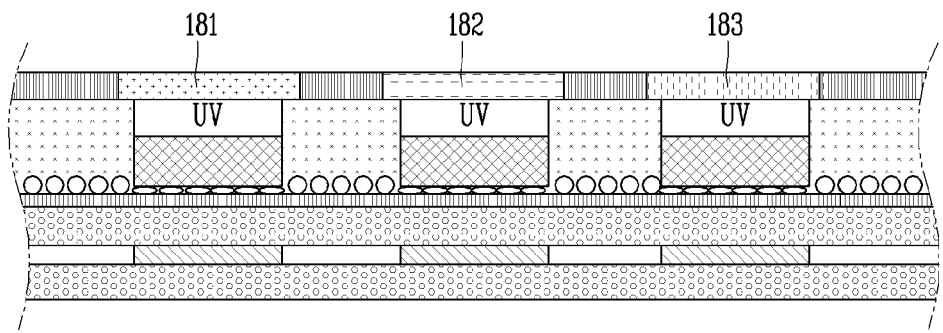

Referring to FIG. 5C, a red phosphor layer 181, a green phosphor layer 182 and blue phosphor layer 183 may be provided on a ultra violet light-emitting diode (UV). As such, the semiconductor light-emitting diode 150 may be used over an entire region up to ultra violet as well as visible light, and may be extended to a form of semiconductor light-emitting diode in which ultra violet UV can be used as an excitation source.

Taking the present example into consideration again, the semiconductor light-emitting diode 150 is placed on the conductive adhesive layer 130 to configure a sub-pixel in the display device. The semiconductor light-emitting diode 150 has an excellent luminance characteristic, and thus it may be possible to configure individual sub-pixels even with a small size thereof. A size of an individual semiconductor light-emitting diode 150 may be a rectangular or square device having a side length of 80 μm or less. In the case of a rectangular shaped element, the size thereof may be less than 20×80 μm.

Furthermore, even when a square shaped semiconductor light-emitting diode 150 with a length of side of 10 μm is used for a sub-pixel, it will exhibit sufficient brightness for implementing a display device. Accordingly, for example, in the case of a rectangular pixel in which one side of a sub-pixel is 600 μm in size, and the remaining one side thereof is 300 μm, a relative distance between the semiconductor light-emitting diodes becomes sufficiently large, thereby implementing a flexible display device of a HD quality The display device using the semiconductor light-emitting diode described above may be manufactured by a new type of manufacturing method, and hereinafter, the manufacturing method will be described with reference to FIG. 6.

Figure 6:
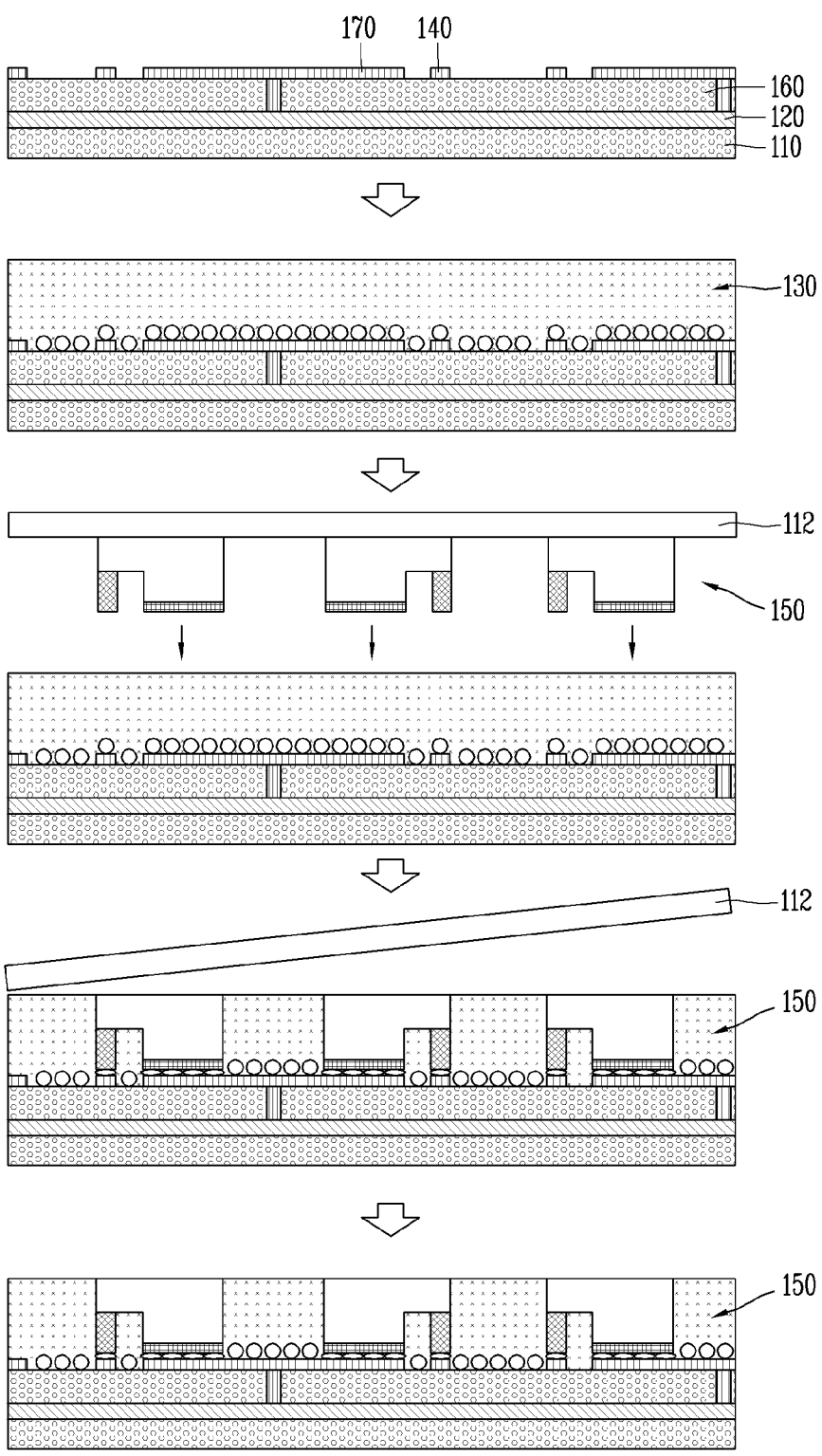
FIG. 6 is cross-sectional views showing a manufacturing method of a display device using a semiconductor light-emitting diode according to the present disclosure.

Referring to FIG. 6, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. The first electrode 120 and second electrode 150 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, and to this end, an anisotropic conductive film may be coated on a substrate located with the insulating layer 160.

Next, a second substrate 112 located with a plurality of semiconductor light-emitting diodes 150 corresponding to the location of the auxiliary electrodes 170 and second electrodes 140 and constituting individual pixels is disposed such that the semiconductor light-emitting diode 150 faces the auxiliary electrode 170 and second electrode 140.

In this case, the second substrate 112 as a growth substrate for growing the semiconductor light-emitting diode 150 may be a sapphire substrate or silicon substrate.

The semiconductor light-emitting diode 150 may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting diode 150 and the auxiliary electrode 170 and second electrode 140 may have conductivity due to the characteristics of an anisotropic conductive film having conductivity by thermal compression, thereby allowing the electrodes and semiconductor light-emitting diode 150 to be electrically connected to each other. At this time, the semiconductor light-emitting diode 150 may be inserted into the anisotropic conductive film, thereby forming a partition wall between the semiconductor light-emitting diodes 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting diodes 150 to the outside. Silicon oxide (SiOx) or the like may be coated on the wiring substrate coupled to the semiconductor light-emitting diode 150 to form a transparent insulating layer (not shown).

Furthermore, it may further include the process of forming a phosphor layer on one surface of the semiconductor light-emitting diode 150. For example, the semiconductor light-emitting diode 150 may be a blue semiconductor light-emitting diode for emitting blue (B) light, and red or green phosphor for converting the blue (B) light into the color of the sub-pixel may form a layer on one surface of the blue semiconductor light-emitting diode.

The manufacturing method or structure of a display device using the foregoing semiconductor light-emitting diode may be modified and implemented in various forms. For such an example, the foregoing display device may be applicable to a vertical semiconductor light-emitting diode. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
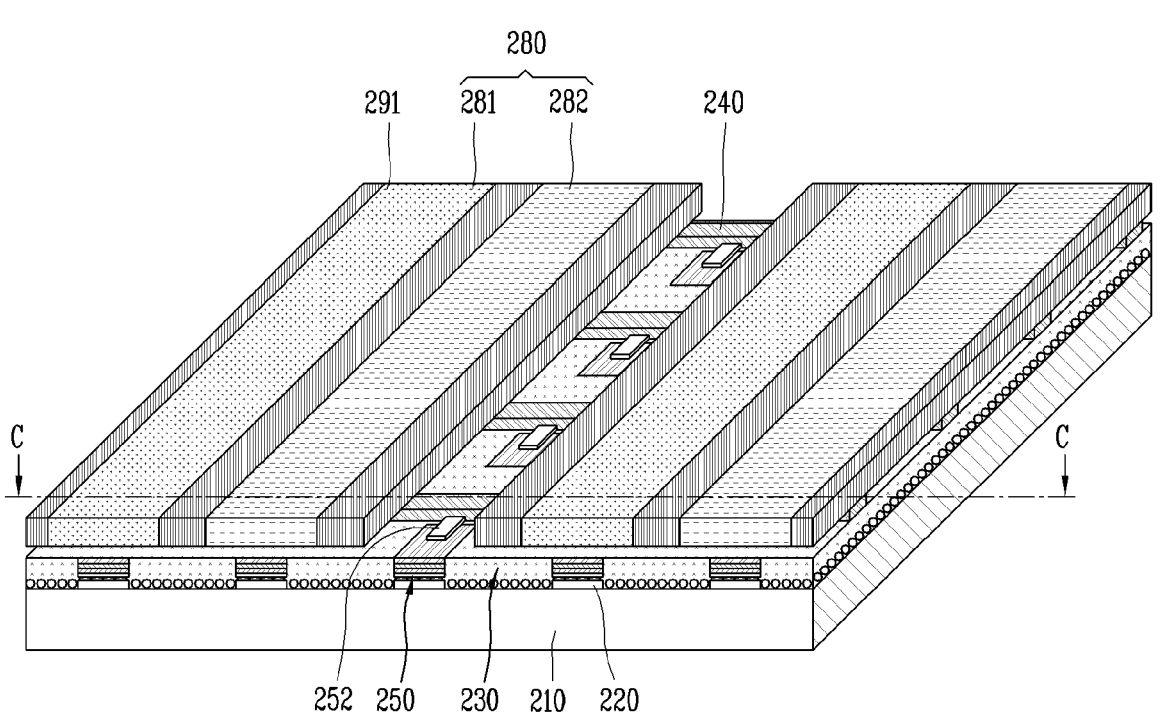
FIG. 7 is a perspective view showing a display device using a semiconductor light-emitting diode according to another embodiment of the present disclosure.
Figure 8:
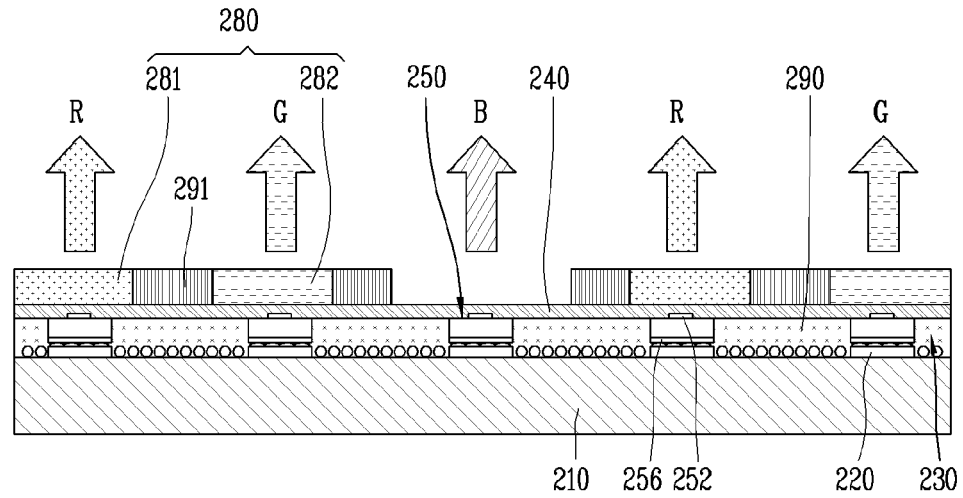
FIG. 8 is a cross-sectional view taken along line D-D in FIG. 7.
Figure 9:
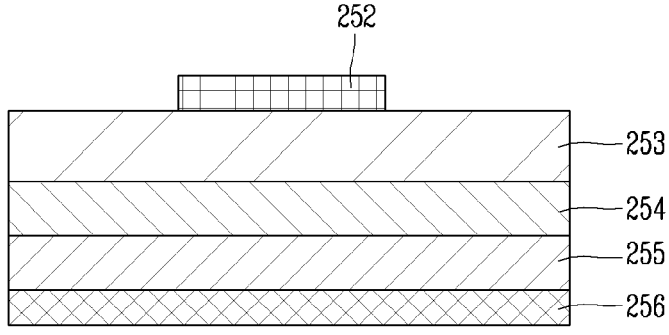
FIG. 9 is a conceptual view showing a vertical semiconductor light-emitting diode in FIG. 8.

FIG. 7 is a perspective view illustrating a display device using a semiconductor light-emitting diode according to another embodiment of the present disclosure, FIG. 8 is a cross-sectional view taken along line C-C in FIG. 7, and FIG. 9 is a conceptual view illustrating a vertical type semiconductor light-emitting diode in FIG. 8.

According to the drawings, the display device may be display device using a passive matrix (PM) type of vertical semiconductor light-emitting diode.

The display device may include a substrate 210, a first electrode 220, a conductive adhesive layer 230, a second electrode 240, and a plurality of semiconductor light-emitting diodes 250.

The substrate 210, which is a wiring board on which the first electrode 220 is disposed, may include polyimide (PI) to implement a flexible display device, in addition, any insulating and flexible material may be used therefor.

The first electrode 220 may be located on the substrate 210, and formed with a bar-shaped electrode elongated in one direction. The first electrode 220 may perform the role of a data electrode.

The conductive adhesive layer 230 is formed on the substrate 210 located with the first electrode 220. Similarly to a display device to which a flip chip type light-emitting diode is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting diode 250 thereto, the semiconductor light-emitting diode 250 is electrically connected to the first electrode 220. At this time, the semiconductor light-emitting diode 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting diode 250 and the first electrode 220.

As such, the semiconductor light-emitting diode 150 is positioned on the conductive adhesive layer 130, thereby constituting a sub-pixel in the display device. The semiconductor light-emitting diode 150 has an excellent luminance characteristic, and thus it may be possible to configure individual sub-pixels even with a small size thereof. A size of an individual semiconductor light-emitting diode 150 may be a rectangular or square device having a side length of 80 μm or less. In the case of a rectangular shaped element, the size thereof may be less than 20×80 μm.

The semiconductor light-emitting diode 250 may be a vertical structure.

A plurality of second electrodes 240 disposed in a direction of crossing the length direction of the first electrode 220, and electrically connected to the vertical semiconductor light-emitting diode 250, respectively, may be located between vertical semiconductor light-emitting diodes.

Referring to FIG. 9, the vertical semiconductor light-emitting diode may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on an n-type semiconductor layer 253. In this case, the p-type electrode 256 located at the bottom thereof may be electrically connected to the first electrode 220 by the adhesive layer 230, and the n-type electrode 252 located at the top thereof may be electrically connected to the second electrode 240 which will be described later. The electrodes may be disposed in the upward/downward direction in the vertical semiconductor light-emitting diode 250, thereby providing a great advantage capable of reducing the chip size.

Referring to FIG. 8, a phosphor layer 280 may be formed on one surface of the semiconductor light-emitting diode 250. For example, the semiconductor light-emitting diode 250 is a blue semiconductor light-emitting diode 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting diode 251 at a location implementing a red sub-pixel, and a green phosphor 282 capable of converting blue light into green (G) light may be deposited on the blue semiconductor light-emitting diode 251 at a location implementing a green sub-pixel. Furthermore, only the blue semiconductor light-emitting diode 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting diode is applied.

Taking the present embodiment into consideration, the second electrode 240 is located between the semiconductor light-emitting diodes 250, and electrically connected to the semiconductor light-emitting diodes 250. For example, the semiconductor light-emitting diodes 250 may be disposed in a plurality of rows, and the second electrode 240 may be located between the rows of the semiconductor light-emitting diodes 250.

Since a distance between the semiconductor light-emitting diodes 250 constituting individual pixels is sufficiently large, the second electrode 240 may be located between the semiconductor light-emitting diodes 250.

The second electrode 240 may be formed with a bar-shaped electrode elongated in one direction, and disposed in a perpendicular direction to the first electrode.

Furthermore, the second electrode 240 may be electrically connected to the semiconductor light-emitting diode 250 by an electrode protruded from the second electrode 240.

Specifically, the connecting electrode may be an n-type electrode 252 of the semiconductor light-emitting diode 250. For example, the n-type conductive electrode 252 is formed with an ohmic electrode for ohmic contact, and the second electrode 240 covers at least part of the ohmic electrode by printing or deposition. Through this, the second electrode 240 may be electrically connected to the n-type electrode 252 of the semiconductor light-emitting diode 250.

As illustrated, the second electrode 240 may be located on the conductive adhesive layer 230, and if necessary, a transparent insulating layer (not shown) including silicon oxide (SiOx) may be formed on the substrate 210 on which the semiconductor light-emitting diode 250 is formed. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

When a transparent electrode such as indium tin oxide (ITO) is used to locate the second electrode 240 on the semiconductor light-emitting diode 250, the ITO material has a problem of bad adhesiveness with the n-type semiconductor 253. Accordingly, the second electrode 240 may be placed between the semiconductor light-emitting diodes 250, thereby obtaining an advantage in which the transparent electrode is not required. Accordingly, an n-type semiconductor layer 253 and a conductive material having a good adhesiveness may be used as a horizontal electrode without being restricted by the selection of a transparent material, thereby enhancing the light extraction efficiency.

According to the drawing, a partition wall 290 may be located between the semiconductor light-emitting diodes 250. The partition wall 290 may be disposed between the vertical semiconductor light-emitting diodes 250 to isolate the semiconductor light-emitting diode 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall 290 by inserting the semiconductor light-emitting diode 250 into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display device.

If the second electrode 240 is precisely located on the conductive adhesive layer 230 between the semiconductor light-emitting diodes 250, the partition wall 290 may be located between the vertical semiconductor light-emitting diodes 250 and the second electrodes 240. Accordingly, individual sub-pixels may be configured even with a small size using the semiconductor light-emitting diode 250, and a distance between the semiconductor light-emitting diodes 250 may be relatively sufficiently large to place the second electrode 240 between the semiconductor light-emitting diodes 250, thereby having the effect capable of implementing a flexible display device of a HD image quality.

In addition, a black matrix 291 may be disposed between the respective phosphor layers to enhance contrast.

As described above, the semiconductor light-emitting diode 250 is positioned on the conductive adhesive layer 230, thereby constituting an individual pixel in the display device. The semiconductor light-emitting diode 250 has an excellent luminance characteristic, and thus it may be possible to configure individual sub-pixels even with a small size thereof. As a result, a full color display in which the sub-pixels of red (R), green (G) and blue (B) constitute one pixel may be implemented by means of the semiconductor light-emitting diodes 250.

Hereinafter, a display device and a method for manufacturing the same according to the present disclosure will be described with reference to the accompanying drawings.

The present disclosure relates to a display device to which a new repair method is applied and a method for manufacturing the same.

As described above, in the case of a display device using a semiconductor light-emitting diode having a size of several to several tens of μm, millions of semiconductor light-emitting diodes are required to implement a large area. Therefore, in order to maintain the quality of a display panel, a solution to a defective semiconductor light-emitting diode and a transfer yield is particularly required.

At present, the semiconductor light-emitting diode defect and the transfer yield problem are solved in the following manner.

First, as a post-process of a semiconductor light-emitting diode transfer process, there is a method of performing a repair process of replacing a defective semiconductor light-emitting diode with a normal semiconductor light-emitting diode or inserting a semiconductor light-emitting diode into a region where the semiconductor light-emitting diode is not transferred.

The repair process is performed differently depending on the type of the semiconductor light-emitting diode.

For example, a repair process of a horizontal or vertical semiconductor light-emitting diode may include removing a defective semiconductor light-emitting diode (a first step); cleaning a surface of a substrate (second step); aligning the substrate and disposing a new semiconductor light-emitting diode at a position from which the defective semiconductor light-emitting diode is removed (third step); and forming an electrode pattern connected to the new semiconductor light-emitting diode (fourth step). In the case of the repair process for a region where the semiconductor light-emitting diode is not transferred, (the first step) may be omitted.

On the other hand, a repair process of a flip-chip type semiconductor light-emitting diode may include removing a defective semiconductor light-emitting diode (first step); replacing a portion (e.g., metal solder, ACF film or the like) to which the semiconductor light-emitting diode is bonded (second step); aligning the substrate and disposing and bonding a new semiconductor light-emitting diode at the position from which the defective semiconductor light-emitting diode is removed through thermocompression bonding (the third step), and similarly, in the case of the repair process for a region where the semiconductor light-emitting diode is not transferred, (the first step) may be omitted.

The repair process requires a precise alignment to selectively remove defective semiconductor light-emitting diodes, and a complicated and difficult process, such as additionally performing a process of forming an electrode pattern having a width of several μm.

Second, there is a method of transferring an extra redundancy semiconductor light-emitting diode together during the semiconductor light-emitting diode transfer process (hereinafter, a redundancy method).

In the redundancy method, a circuit design for driving the semiconductor light-emitting diode becomes complicated since twice the number of semiconductor light-emitting diodes are used, and above all, it is very inefficient in terms of cost.

The present disclosure provides a display device to which a new repair method is applied and a method for manufacturing the same.

The display device according to the present disclosure may be implemented in a passive matrix (PM) method or an active matrix (AM) method. Herein, a detailed description thereof will be omitted.

The display device according to the present disclosure includes a substrate 1000 and semiconductor light-emitting diodes 1050 disposed on the substrate 1000. The display device according to the present disclosure uses a semiconductor light-emitting diode 1050 having a size of several to several tens of μm, and the semiconductor light-emitting diode 1050 having a size of several to several tens of μm may be a horizontal type, a vertical type, or a flip-chip type.

In addition, the display device according to the present disclosure includes a planarization layer 1100 formed to cover the semiconductor light-emitting diodes 1050 and a wiring electrode 1200 electrically connected to the semiconductor light-emitting diodes 1050.

The substrate 1000 includes individual pixel regions 1210 in which the semiconductor light-emitting diodes 1050 are disposed. In other words, the semiconductor light-emitting diodes 1050 may be disposed on predetermined individual pixel regions 1210 on the substrate 1000. The individual pixel regions 1210 may be arranged in row and column directions of the substrate 1000.

The semiconductor light-emitting diodes 1050 emitting the same color or the semiconductor light-emitting diodes 1050 that emit different colors may be disposed in the individual pixel regions 1210. For example, semiconductor light-emitting diodes emitting blue (B) or semiconductor light-emitting diodes emitting red (R), green (G), and blue (B) may be disposed in the individual pixel regions 1210. The semiconductor light-emitting diodes emitting red (R), green (G), and blue (B) may be sequentially disposed in the individual pixel regions 1210.

Furthermore, the substrate 1000 may include sub-pixel regions 1200 configured with a plurality of adjacent individual pixel regions 1210. In one embodiment, the sub-pixel regions 1200 may be configured with three adjacent individual pixel regions 1210 arranged in a row direction of the substrate 1000 based on the accompanying drawings, and in particular, when the semiconductor light-emitting diodes that emit red (R), green (G), and blue (B) are disposed in the individual pixel regions 1210, one sub-pixel region 1200 may be configured with individual pixel regions 1210 in which the red (R), green (G), and blue (B) semiconductor light-emitting diodes are disposed.

However, the description of the individual pixel regions 1210 and the sub-pixel regions 1200 is merely one example, and the present disclosure is not limited thereto.

Hereinafter, a display device to which a new repair method is applied according to the type of the semiconductor light-emitting diode 1050 and a method for manufacturing the same will be described.

Herein, a case in which a horizontal semiconductor light-emitting diode 1050a and a flip-chip type semiconductor light-emitting diode 1050b are used will be described, and as for the vertical semiconductor light-emitting diode, the case of using the horizontal semiconductor light-emitting diode

1050a described herein may also be applied in the same manner except for the wiring structure.

First, a display device using the horizontal semiconductor light-emitting diode 1050a and a method for manufacturing the same will be described with reference to FIGS. 10 to 13 and 18A to 18C.

Figure 10:
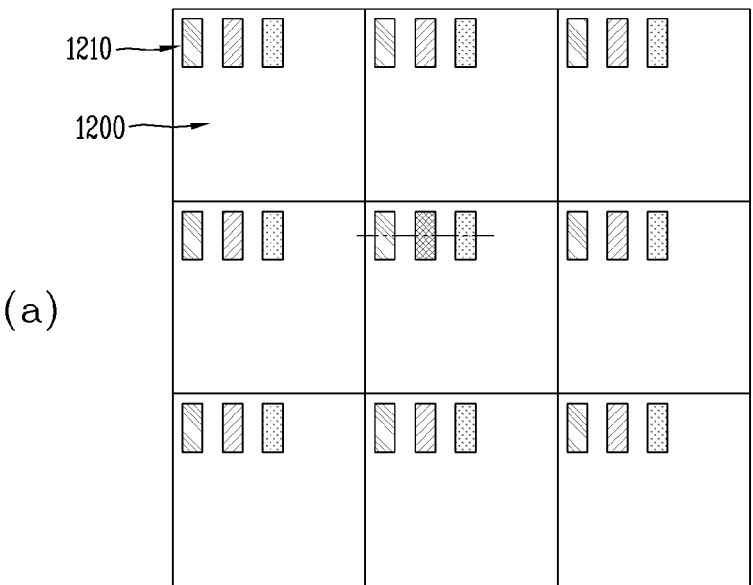
FIGS. 10 and 14 are cross-sectional views of sub-pixel units and a sub-pixel unit including a defective semiconductor light-emitting diode of a display device.
Figure 10:
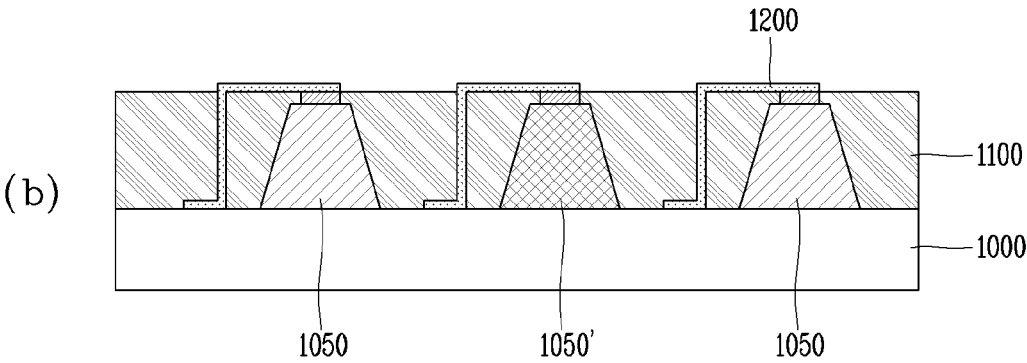

FIG. 10 is a cross-sectional view of sub-pixel units and a sub-pixel unit including a defective semiconductor light-emitting diode of a display device, and FIGS. 11 to 13 are conceptual views for explaining various embodiments of a repair structure applied to the display device according to FIG. 10.

Referring to the drawing, the individual pixel regions 1210 may include a first individual pixel region 1211 and a second individual pixel region 1212.

The first individual pixel region 1211 is a region in which the semiconductor light-emitting diodes 1050 are disposed to emit light output from the semiconductor light-emitting diode 1050, and the second individual pixel region 1212 may be a region in which the repair layer 1300 is disposed to emit light output from the first individual pixel region 1211 adjacent thereto.

According to the present disclosure, the individual pixel regions 1210 may correspond to either one of the first individual pixel region 1211 and the second individual pixel region 1212.

Furthermore, referring to the drawing, the sub-pixel regions 1200 may include a first sub-pixel region 1200a, a second sub-pixel region 1200b, and a third sub-pixel region 1200c.

The first sub-pixel region 1200a may be a region configured with only the first individual pixel regions 1211, the second sub-pixel region 1200b may be a region configured with only the second sub-pixel regions 1212, and the third sub-pixel region 1200c may be a region configured with the first and second individual pixel regions 1211, 1212.

According to the present disclosure, the sub-pixel regions 1200 may correspond to any one of the first sub-pixel region 1200a, the second sub-pixel region 1200b, and the third sub-pixel region 1200c.

In one embodiment, referring to FIGS. 10 and 11, the second individual pixel region 1212 may be an individual pixel region in which a defective semiconductor light-emitting diode 1050' has been disposed. In this case, the defective semiconductor light-emitting diode 1050', the planarization layer 1100 covering the defective semiconductor light-emitting diode 1050', and the wiring electrode 1200 electrically connected to the defective semiconductor light-emitting diode 1050' may be selectively removed, and then the repair layer 1300 may be formed on the relevant individual pixel region 1210.

According to this embodiment, the substrate 1000 includes a first sub-pixel region 1200a configured with only the first individual pixel regions 1211 and a third sub-pixel region 1200c configured with the first and second individual pixel regions 1211, 1212.

For another embodiment, referring to FIGS. 10 and 12, the second individual pixel region 1212 may be an individual pixel region in which the defective semiconductor light-emitting diode 1050' has been disposed and individual pixel regions adjacent to the individual pixel region. Here, the adjacent individual pixel regions may be individual pixel regions included in the same sub-pixel region. In this case, the semiconductor light-emitting diodes 1050, 1050' disposed in a sub-pixel region including the defective semiconductor light-emitting diode 1050', the planarization layer 1100 formed to cover them, and the wiring electrode 1200 electrically connected thereto may be all removed, and then the repair layer 1300 may be formed on each of the respective individual pixel regions 1210.

According to this embodiment, the substrate 1000 has a first sub-pixel region 1200a configured with only the first individual pixel regions 1211 and a second sub-pixel region 1200b configured with only the second individual pixel regions 1212.

Furthermore, the repair layer 1300 of the second sub-pixel region 1200b may be continuously formed over a plurality of individual pixel regions 1210 constituting the second sub-pixel region 1200b. That is, the repair layer 1300 may be formed in each of the individual pixel regions 1210 and in a region therebetween so that one sub-pixel region 1200 appears to include one second individual pixel region 1212. Here, as for the repair layer 1300, a cross section perpendicular to the stacking direction of the substrate 1000 may have a rectangular shape, as shown in FIG. 12, and may further have various shapes such as a circular shape or an oval shape.

For another embodiment, referring to FIGS. 10 and 13, the second individual pixel region 1212 may be an individual pixel region in which the defective semiconductor light-emitting diode 1050's has been disposed. In this case, the defective semiconductor light-emitting diode 1050', the planarization layer 1100 covering the defective semiconductor light-emitting diode 1050', and the wiring electrode 1200 electrically connected to the defective semiconductor light-emitting diode 1050' may be selectively removed, and then the repair layer 1300 may be formed on the relevant individual pixel region 1210.

According to this embodiment, the substrate 1000 includes a first sub-pixel region 1200a configured with only the first individual pixel regions 1211 and a third sub-pixel region 1200c configured with the first and second individual pixel regions 1211, 1212.

Meanwhile, according to the present embodiment, as shown in FIG. 13, an extended repair layer 1310 formed to surround the plurality of individual pixel regions 1211, 1212 constituting the third sub-pixel region 1200c may be further included. The extended repair layer 1310 may emit a greater amount of light output from the adjacent sub-pixel region 1200 to an upper portion of the substrate 1000.

The extended repair layer 1310 may be formed to have a width of several μm. Furthermore, the extended repair layer 1310 may include discontinuous points 1311a, 1311b. The extended repair layer 1310 may include discontinuous points 1311a, 1311b so as not to damage the wiring electrode 1200 electrically connected to the semiconductor light-emitting diodes 1050 disposed in the first individual pixel region 1211 constituting the third sub-pixel region 1200c.

In the above-described embodiments, the repair layer 1300 may be formed of a material having a smaller refractive index than that of the planarization layer 1100. For example, the repair layer 1300 may be formed of a polymer or resin having a smaller refractive index than that of the planarization layer 1100. Alternatively, the repair layer 1300 may be formed of a porous material.

Furthermore, the repair layer 1300 may include a scatterer or a reflector. The scatterer or reflector included in the repair layer 1300 may be, for example, a material such as $SiO_2$, $TiO_2$, $ZrO_2$, $Al_2O_3$, $Sb_2O_3$, ZnO, MgO, or the like.

As described above, since the repair layer 1300 is formed of a material having a smaller refractive index than that of the planarization layer 1100, light output from the first individual pixel region 1211 or the sub-pixel region 1200 adjacent thereto may travel through the planarization layer 1100 to be guided to the repair layer 1300. Moreover, since the repair layer 1300 includes a scatterer or a reflector, the light guided to the repair layer 1300 may be emitted to the upper portion of the substrate 1000.

Therefore, even when the second individual pixel region 1212 does not include the semiconductor light-emitting diode 1050, the light output from the surroundings may be emitted through the repair layer 1300 according to the above-described principle, thereby exhibiting the same effect as the presence of an illuminant.

Meanwhile, when driving the display device according to the present disclosure, the semiconductor light-emitting diodes 1050 disposed in the first individual pixel region 1211 in the third sub-pixel region 1200c may be driven in consideration of the color and luminance to be expressed. The specific driving method is as follows.

(Driving Example 1) Method of Driving Semiconductor Light-emitting diode 1050 Disposed in First Individual Pixel Region 1211 in Third Sub-Pixel Region 1200c Including One Second Individual Pixel Region 1212 And Two First Individual Pixel Regions 1211

First, a repair efficiency value (or a repair pixel luminance reduction value, a) is defined. The repair efficiency value is a value derived when a (second value) is divided by a (first value) through measuring an intensity (first value) of light when emitting all colors corresponding to the second individual pixel regions 1212 in the surrounding sub-pixel regions 1200 that surround the third sub-pixel region 1200c, and measuring an intensity (second value) of light scattered or reflected in the second individual pixel region 1212.

If the color to be expressed by the third sub-pixel region 1200c is a color composed of a combination of the semiconductor light-emitting diodes 1050 disposed in the two first individual pixel regions 1211, the semiconductor light-emitting diodes 1050 disposed in the two first individual pixels regions 1211 may be normally driven, but may be driven by correcting the luminance x to be 1−a<x<1 in consideration of the second individual pixel region 1212 including the scatterer.

On the other hand, when the color to be expressed by the third sub-pixel region 1200c is a color that requires the semiconductor light-emitting diode 1050 disposed in one second individual pixel region 1212, the semiconductor light-emitting diodes 1050 disposed in the two first individual pixel regions 1211 may not be driven or may be driven by correcting the luminance x to be x<a·y. Here, y denotes an originally required luminance.

(Driving Example 2) Method of Driving Semiconductor Light-emitting diode 1050 Disposed in First Individual Pixel Region 1211 in Third Sub-Pixel Region 1200c Including Two Second Individual Pixel Regions 1212 And One First Individual Pixel Region 1211

First, the repair efficiency value (or repair pixel luminance reduction value, a) is defined.

The repair efficiency value is a value derived when a (second value) is divided by a (first value) through measuring an intensity (first value) of light when emitting a color corresponding to the two second individual pixel regions 1212 at a luminance ratio of 1:1 in the surrounding sub-pixel regions 1200 that surround the third sub-pixel region 1200c, and measuring an intensity (second value) of light scattered or reflected in the second individual pixel regions 1212.

If the color to be expressed by the third sub-pixel region 1200c can be expressed by the semiconductor light-emitting diodes disposed in one first individual pixel region 1211, the semiconductor light-emitting diodes 1050 disposed in the one first individual pixel region 1211 may be driven at a luminance (x) of 1−a.

On the other hand, when the color to be expressed by the third sub-pixel region 1200c requires a color corresponding to two second individual pixel regions 1212, the semiconductor light-emitting diodes 1050 disposed in the first individual pixel region 1211 may be driven by correcting the luminance x to be x<a·y. Here, y denotes an originally required luminance.

Such a driving method may contribute to allowing light emitted from the second individual pixel region 1212 or the second or third sub-pixel regions 1200b, 1200c including the second individual pixel region 1212 to be recognized in a similar and natural manner to light emitted from the first individual pixel region 1211 or the first sub-pixel region 1200a.

FIGS. 18A to 18C are conceptual views for respectively explaining a method of manufacturing the repair structure according to FIGS. 11 to 13.

First, a step of disposing the semiconductor light-emitting diodes 1050 in the individual pixel region 1210 of the substrate 1000 may be performed. In this step, the semiconductor light-emitting diodes 1050 may be transferred to and disposed on the substrate 1000 in various ways.

Next, a step of forming the planarization layer 1100 to cover the semiconductor light-emitting diodes 1050, and forming the wiring electrode 1200 electrically connected to the semiconductor light-emitting diode 1050 on the planarization layer 1100 may be performed.

Next, a step of removing the defective semiconductor light-emitting diode 1050' from among the semiconductor light-emitting diodes 1050, the planarization layer 1100 covering the defective semiconductor light-emitting diode 1050', and the wiring electrode 1200 electrically connected to the defective semiconductor light-emitting diode 1050' may be performed, and then a step of forming the repair layer 1300 on the individual pixel region 1210 from which the defective semiconductor light-emitting diode 1050' is removed may be performed.

Hereinafter, a step of removing the defective semiconductor light-emitting diode 1050' and forming the repair layer 1300 will be described in detail with reference to FIGS. 18A to 18C.

FIG. 18A shows a method of manufacturing the repair structure according to FIG. 11.

Referring to FIG. 18A, first, a step of removing the defective semiconductor light-emitting diode 1050' may be performed. Specifically, the defective semiconductor light-emitting diode 1050' disposed in the individual pixel region 1210 may be selectively removed by a laser. Here, the planarization layer 1100 covering the defective semiconductor light-emitting diode 1050' and the wiring electrode 1200 electrically connected to the defective semiconductor light-emitting diode 1050' may be removed together.

Next, a step of forming the repair layer 1300 in the individual pixel region 1210 from which the defective semiconductor light-emitting diode 1050' is removed may be performed. This step may be performed by filling a polymer or resin having a smaller refractive index than that of the planarization layer 1100 into the individual pixel region 1210 from which the defective semiconductor light-emitting diode 1050' is removed using a method such as dispensing or inkjet, and then applying heat or UV to cure the polymer or resin. Here, the polymer or resin may include a scatterer or a reflector.

FIG. 18B shows a method of manufacturing the repair structure according to FIG. 12.

Referring to FIG. 18B, first, a step of removing the defective semiconductor light-emitting diode 1050' and the semiconductor light-emitting diodes 1050 adjacent thereto may be performed. Here, the semiconductor light-emitting diodes 1050 adjacent to the defective semiconductor light-emitting diode 1050' may denote semiconductor light-emitting diodes 1050 disposed in the same sub-pixel region 1200 as the defective semiconductor light-emitting diode 1050'. That is, according to the present embodiment, all the semiconductor light-emitting diodes 1050 disposed in one sub-pixel region 1200 including the defective semiconductor light-emitting diode 1050' may be removed. In addition, the planarization layer 1100 formed to cover them and the wiring electrode 1200 electrically connected thereto may also be removed.

Next, a step of forming the repair layer 1300 in the individual pixel region 1210 from which the semiconductor light-emitting diode 1050 is removed may be performed. According to the present embodiment, the repair layer 1300 may be formed to extend from the individual pixel region 1210 from which the defective semiconductor light-emitting diode 1050' is removed to the individual pixel region 1210 from which the semiconductor light-emitting diode 1050 adjacent to the defective semiconductor light-emitting diode 1050' is removed. That is, the repair layer 1300 may be continuously formed over the plurality of individual pixel regions 1210.

FIG. 18C shows a method of manufacturing the repair structure according to FIG. 13.

Referring to FIG. 18C, first, a step of removing the defective semiconductor light-emitting diode 1050' may be performed. Specifically, the defective semiconductor light-emitting diode 1050' disposed in the individual pixel region 1210 may be selectively removed by a laser. Here, the planarization layer 1100 covering the defective semiconductor light-emitting diode 1050' and the wiring electrode 1200 electrically connected to the defective semiconductor light-emitting diode 1050' may be removed together.

Furthermore, according to the present embodiment, a portion of the planarization layer 1100 around the sub-pixel region 1200 including the defective semiconductor light-emitting diode 1050' may be further removed. For example, the planarization layer 1100 may be removed in a pattern surrounding the sub-pixel region 1200, and may include some discontinuous points 1311a, 1311b, that is, portions that are not removed.

Next, a step of forming the repair layer 1300 in the individual pixel regions 1210 from which the defective semiconductor light-emitting diode 1050' is removed and on a region from which the planarization layer 1100 around the sub-pixel region 1200 including the defective semiconductor light-emitting diode 1050' is removed may be performed. The repair layer 1300 formed around the sub-pixel region 1200 corresponds to the above-described extended repair layer 1310.

On the other hand, although FIGS. 18A to 18C illustrate a case where the defective semiconductor light-emitting diode 1050' is included as an example, the above-described steps may also be applicable in a similar manner even when the semiconductor light-emitting diode 1050 is not transferred to the individual pixel region 1210. In this case, in the step of removing the defective semiconductor light-emitting diode 1050', the planarization layer 1100 and the wiring electrode 1200 may be removed.

Next, a display device using the flip-chip semiconductor light-emitting diode 1050*b* and a method for manufacturing the same will be described with reference to FIGS. 14 to 17 and 19A to 19C.

FIG. 14 is a cross-sectional view of sub-pixel units and a sub-pixel unit including a defective semiconductor light-emitting diode of a display device, and FIGS. 15 to 17 are conceptual views for explaining various embodiments of a repair structure applied to the display device according to FIG. 14.

Referring to the drawing, the individual pixel regions 1210 may include a first individual pixel region 1211 and a second individual pixel region 1212.

The first individual pixel region 1211 is a region in which the semiconductor light-emitting diodes 1050 are disposed to emit light output from the semiconductor light-emitting diode 1050, and the second individual pixel region 1212 may be a region in which the repair layer 1300 is disposed to emit light output from the first individual pixel region 1211 adjacent thereto.

According to the present disclosure, the individual pixel regions 1210 may correspond to either one of the first individual pixel region 1211 and the second individual pixel region 1212.

Furthermore, referring to the drawing, the sub-pixel regions 1200 may include a first sub-pixel region 1200*a*, a second sub-pixel region 1200*b*, and a third sub-pixel region 1200*c*.

The first sub-pixel region 1200*a* may be a region configured with only the first individual pixel regions 1211, the second sub-pixel region 1200*b* may be a region configured with only the second sub-pixel regions 1212, and the third sub-pixel region 1200*c* may be a region configured with the first and second individual pixel regions 1211, 1212.

According to the present disclosure, the sub-pixel regions 1200 may correspond to any one of the first sub-pixel region 1200*a*, the second sub-pixel region 1200*b*, and the third sub-pixel region 1200*c*.

In one embodiment, referring to FIGS. 14 and 15, the second individual pixel region 1212 may be an individual pixel region in which a defective semiconductor light-emitting diode 1050' has been disposed. In this case, the defective semiconductor light-emitting diode 1050' and the wiring electrode 1200 electrically connected to the defective semiconductor light-emitting diode 1050' may be selectively removed, and then the repair layer 1300 may be formed on the relevant individual pixel region 1210.

According to this embodiment, the substrate 1000 may include a first sub-pixel region 1200*a* configured with only the first individual pixel regions 1211 and a third sub-pixel region 1200*c* configured with the first and second individual pixel regions 1211, 1212.

Meanwhile, the display device according to the present embodiment may include the planarization layer 1100 formed on an entire surface of the substrate 1000 to cover the semiconductor light-emitting diodes 1050 and the repair layer 1300. That is, a single planarization layer 1100 may be formed on the substrate 1000.

For another embodiment, referring to FIGS. 14 and 16, the second individual pixel region 1212 may be an individual pixel region in which the defective semiconductor light-emitting diode 1050'*s* has been disposed. In this case, the defective semiconductor light-emitting diode 1050' and the wiring electrode 1200 electrically connected to the defective semiconductor light-emitting diode 1050' may be selectively removed, and then the repair layer 1300 may be formed on the relevant individual pixel region 1210.

According to this embodiment, the substrate 1000 may include a first sub-pixel region 1200*a* configured with only the first individual pixel regions 1211 and a third sub-pixel region 1200*c* configured with the first and second individual pixel regions 1211, 1212.

Meanwhile, the display device according to the present embodiment may include two planarization layers 1110, 1120 having different refractive indices. Specifically, the planarization layer 1100 may include a first planarization layer 1110 having a first refractive index and a second planarization layer 1120 having a second refractive index that is smaller than the first refractive index.

The first planarization layer 1110 may be formed to cover at least the individual sub-pixel regions 1210 constituting the third sub-pixel region 1200*c* including the second individual pixel region 1212.

Preferably, the first planarization layer 1110 may be formed to extend to the first sub-pixel region 1200*a* adjacent to the third sub-pixel region 1200*c* to cover the individual pixel regions 1210 constituting the first sub-pixel region 1200*a* adjacent thereto.

For another embodiment, referring to FIGS. 14 and 17, the second individual pixel region 1212 may be an individual pixel region in which the defective semiconductor light-emitting diode 1050'*s* has been disposed. In this case, the defective semiconductor light-emitting diode 1050' and the wiring electrode 1200 electrically connected to the defective semiconductor light-emitting diode 1050' may be selectively removed, and then the repair layer 1300 may be formed on the relevant individual pixel region 1210.

According to this embodiment, the substrate 1000 may include a first sub-pixel region 1200*a* configured with only the first individual pixel regions 1211 and a third sub-pixel region 1200*c* configured with the first and second individual pixel regions 1211, 1212.

Meanwhile, the display device according to the present embodiment may also include the above-described first and second planarization layers 1110, 1120.

Preferably, the first planarization layer 1110 may be formed to cover the third sub-pixel region 1200*c* and at least a portion of the first sub-pixel region 1200*a* adjacent to the third sub-pixel region 1200*c*, and for example, may be formed to cover regions other than the first individual pixel regions 1211 in the adjacent first sub-pixel region 1200*a*.

As shown in FIGS. 16 and 17, when the first planarization layer 1110 is formed to extend to the adjacent first sub-pixel region 1200*a*, scattered light may be maximized. Specifically, an amount of light guided to the third sub-pixel region 1200*c* from among the light output from the adjacent first sub-pixel region 1200*a* increases, thereby having an effect of maximizing the scattered light as a result.

Meanwhile, as shown in FIG. 16, when the first planarization layer 1110 is formed to cover the first individual pixel regions 1211 constituting the adjacent first sub-pixel region 1200*a*, some light emitted from the first individual pixel regions 1211 is guided to the third sub-pixel region 1200*c* to reduce the light extraction efficiency of the first sub-pixel region 1200*a* Accordingly, in this case, the first individual pixel regions 1211 constituting the first sub-pixel region 1200*a* may be driven by compensating to generate an output that is higher than the input signal.

FIGS. 19A to 19C are conceptual views for respectively explaining a method of manufacturing the repair structure according to FIGS. 15 to 17.

First, a step of forming the wiring electrode 1200 on the substrate 1000 and disposing the semiconductor light-emitting diodes 1050 to be electrically connected to the wiring electrode 1200 in the individual pixel region 1210 of the substrate 1000 may be performed. In this step, the semiconductor light-emitting diodes 1050 may be transferred to and disposed on the substrate 1000 in various ways.

Next, a step of removing the defective semiconductor light-emitting diode 1050' from among the semiconductor light-emitting diodes 1050 and the wiring electrode 1200 electrically connected to the defective semiconductor light-emitting diode 1050' may be performed. FIG. 19B shows a method of manufacturing the repair structure according to FIG. 16.

Specifically, the defective semiconductor light-emitting diode 1050' disposed in the individual pixel region 10 may be selectively removed by a laser. Here, the wiring electrode 1200 electrically connected to the defective semiconductor light-emitting diode 1050' may be removed at the same time.

Next, a step of forming the repair layer 1300 in the individual pixel region 1210 from which the defective semiconductor light-emitting diode 1050' is removed may be performed. This step may be performed by filling a polymer or resin having a smaller refractive index than that of the planarization layer 1100 into the individual pixel region 1210 from which the defective semiconductor light-emitting diode 1050' is removed using a method such as dispensing or inkjet, and then applying heat or UV to cure the polymer or resin. Here, the polymer or resin may include a scatterer or a reflector.

Hereinafter, a step of forming the planarization layer 1100 will be described in detail with reference to FIGS. 19A to 19C.

FIG. 19A shows a method of manufacturing the repair structure according to FIG. 15.

Referring to FIG. 19A, a step of forming the planarization layer 1100 to cover the semiconductor light-emitting diodes 1050 and the repair layer 1300 may be performed. The planarization layer 1100 may be formed on an entire surface of the substrate 1000 to form a single planarization layer 1100.

FIG. 19B shows a method of manufacturing the repair structure according to FIG. 16.

Referring to FIG. 19B, a first planarization layer 1110 and a second planarization layer 1120 may be formed. Specifically, the first planarization layer 1110 may be formed to cover at least the repair layer 1300 and the semiconductor light-emitting diodes 1050 adjacent to the repair layer 1300. Here, the semiconductor light-emitting diodes 1050 adjacent to the repair layer 1300 may be semiconductor light-emitting diodes 1050 disposed in the same sub-pixel region 1200 as the repair layer 1300.

Referring to FIG. 19B, the first planarization layer 1110 may be formed to extend to the repair layer 1300, the semiconductor light-emitting diodes 1050 adjacent to the repair layer 1300, and the individual pixel regions 1210 of the first sub-pixel region 1200*a* adjacent to the third sub-pixel region 1200*c* including the repair layer 1300 and the semiconductor light-emitting diodes 1050 adjacent to the repair layer 1300.

Next, a step of forming the second planarization layer 1120 on an entire surface of the substrate 1000 may be performed. Accordingly, the second planarization layer 1120 is formed to cover the first planarization layer 1110 as well as the semiconductor light-emitting diodes 1050.

FIG. 19C shows a method of manufacturing the repair structure according to FIG. 17.

According to FIG. 19C, as shown in FIG. 19B, the first planarization layer 1110 and the second planarization layer 1120 may be formed, and the first planarization layer 1110 may be formed to cover at least the repair layer 1300 and the semiconductor light-emitting diodes 1050 adjacent the repair layer 1300, that is, the semiconductor light-emitting diodes 1050 disposed in the same sub-pixel region 1200 as the repair layer 1300.

Referring to FIG. 19C, the first planarization layer 1110 may be formed to extend to the repair layer 1300, the semiconductor light-emitting diodes 1050 adjacent to the repair layer 1300, and the first sub-pixel region 1200*a* adjacent to the third sub-pixel region 1200*c* including the repair layer 1300 and the semiconductor light-emitting diodes 1050 adjacent to the repair layer 1300 and in this case, may be formed to cover regions other than the first individual pixel regions 1211 constituting the first sub-pixel region 1200*a* in the first sub-pixel region 1200*a*.

Next, a step of forming the second planarization layer 1120 on an entire surface of the substrate 1000 may be performed. Accordingly, the second planarization layer 1120 is formed to cover the first planarization layer 1110 as well as the semiconductor light-emitting diodes 1050.

Meanwhile, the first planarization layer 1110 may be a layer having a larger refractive index than that of the second planarization layer 1120. Accordingly, light emitted from the sub-pixel region 1200 covered with the second planarization layer 1120 may be guided to the first planarization layer 1110, and thus the third sub-pixel region 1200*c* including the repair layer 1300 may be recognized as if an illuminant is present.

On the other hand, although FIGS. 19A to 19C illustrate a case where the defective semiconductor light-emitting diode 1050' is included as an example, the above-described steps may also be applicable in a similar manner even when the semiconductor light-emitting diode 1050 is not transferred to the individual pixel region 1210. In this case, in the step of removing the defective semiconductor light-emitting diode 1050', the wiring electrode 1200 may be removed.

The display device according to the present disclosure may be manufactured by means of a method of forming the repair layer 1300 without inserting a new semiconductor light-emitting diode 1050 at a position where the defective semiconductor light-emitting diode 1050' is removed, and scattering and reflecting light therearound, and therefore, the quality of a display panel may be maintained while at the same time, there is no need to form the wiring electrode 1200 electrically connected to the replaced semiconductor light-emitting diode 1050 as in a repair process in the related art, thereby simplifying a post-process.

What is claimed is:

1. A display device comprising:
   a substrate;
   semiconductor light-emitting diodes disposed on the substrate;
   a planarization layer formed to cover the semiconductor light-emitting diodes; and
   a wiring electrode electrically connected to the semiconductor light-emitting diodes,
   wherein the substrate comprises individual pixel regions in which the semiconductor light-emitting diodes are disposed, and
   wherein the individual pixel regions comprises:
      a first individual pixel region in which the semiconductor light-emitting diodes are disposed to emit light output from the semiconductor light-emitting diodes; and
      a second individual pixel region in which a repair layer is disposed to emit light output from the first individual pixel region adjacent thereto, and wherein the repair layer is formed of a material having a smaller refractive index than a material of the planarization layer.

2. The display device of claim 1, wherein the substrate comprises sub-pixel regions configured with a plurality of adjacent individual pixel regions, and wherein each of the sub-pixel regions comprises:

a first sub-pixel region configured with only the first individual pixel region;

a second sub-pixel region configured with only the second individual pixel region; and a third sub-pixel region configured with the first and second individual pixel regions.

3. The display device of claim 2, wherein the repair layer is continuously formed over a plurality of individual pixel regions constituting the second sub-pixel region.

4. The display device of claim 2, further comprising:

an extended repair layer formed to surround a plurality of individual pixel regions constituting the third sub-pixel region, wherein the extended repair layer comprises a discontinuous point.

5. The display device of claim 1, wherein the repair layer comprises a scatterer or a reflector.

6. The display device of claim 2, wherein the planarization layer comprises:

a first planarization layer having a first refractive index; and a second planarization layer having a second refractive index smaller than that of the first refractive index, and wherein the first planarization layer is formed to cover individual pixel regions constituting the third sub-pixel region.

7. The display device of claim 6, wherein the first planarization layer is formed to extend to a first sub-pixel region adjacent to the third sub-pixel region to cover individual pixel regions constituting the first sub-pixel region that is adjacent to the third sub-pixel region.

8. The display device of claim 6, wherein the first planarization layer is formed to cover the third sub-pixel region and at least a portion of the first sub-pixel region adjacent to the third sub-pixel region.

* * * * *